(12) United States Patent
Ueda et al.

(10) Patent No.: US 11,987,880 B2
(45) Date of Patent: May 21, 2024

(54) MANUFACTURING METHOD AND INSPECTION METHOD OF INTERIOR MEMBER OF PLASMA PROCESSING APPARATUS

(71) Applicant: Hitachi High-Tech Corporation, Tokyo (JP)

(72) Inventors: Kazuhiro Ueda, Tokyo (JP); Masaru Kurihara, Tokyo (JP); Kazuyuki Ikenaga, Tokyo (JP); Tomoyuki Tamura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 921 days.

(21) Appl. No.: 16/979,671

(22) PCT Filed: Dec. 23, 2019

(86) PCT No.: PCT/JP2019/050252
§ 371 (c)(1),
(2) Date: Sep. 10, 2020

(87) PCT Pub. No.: WO2021/130797
PCT Pub. Date: Jul. 1, 2021

(65) Prior Publication Data
US 2023/0101039 A1 Mar. 30, 2023

(51) Int. Cl.
*C23C 16/44* (2006.01)
*C23C 4/134* (2016.01)
(Continued)

(52) U.S. Cl.
CPC .......... *C23C 16/4404* (2013.01); *C23C 4/134* (2016.01); *G01N 23/20* (2013.01);
(Continued)

(58) Field of Classification Search
CPC .... C23C 16/4404; C23C 4/134; G01N 23/20; H01J 37/32495; H01J 2237/332
See application file for complete search history.

(56) References Cited

U.S. PATENT DOCUMENTS

2004/0126614 A1 7/2004 Maeda et al.
2007/0044716 A1* 3/2007 Tetsuka ............. H01J 37/32559
118/723 I
(Continued)

FOREIGN PATENT DOCUMENTS

JP H0820858 A 1/1996
JP H0961318 A 3/1997
(Continued)

OTHER PUBLICATIONS

Office Action mailed Feb. 17, 2022 in U.S. Appl. No. 16/357,971.
(Continued)

*Primary Examiner* — Nathan T Leong
(74) *Attorney, Agent, or Firm* — Miles & Stockbridge, P.C.

(57) ABSTRACT

Provided is a manufacturing method of an interior member of a plasma processing apparatus, which improves processing yield. The interior member is disposed inside a processing chamber of the plasma processing apparatus and includes, on a surface thereof, a film of a material having resistance to plasma. The manufacturing method includes: a step of moving a gun by a predetermined distance along the surface of the interior member to spray the material to form the film, and disposing a test piece having a surface having a shape simulating a surface shape of the interior member within a range of the distance within which the gun is moved and forming the film of the material on the surface of the test piece; and a step of adjusting, based on a result of detecting a crystal size of the film on the surface of the test piece and presence or absence of a residual stress or inclusion of a
(Continued)

contaminant element, a condition of forming the film on the surface of the interior member by the gun.

16 Claims, 16 Drawing Sheets

(51) Int. Cl.
   *G01N 23/20* (2018.01)
   *H01J 37/32* (2006.01)
   *H01L 21/3065* (2006.01)
(52) U.S. Cl.
   CPC .... *H01J 37/32495* (2013.01); *H01L 21/3065* (2013.01); *H01J 2237/332* (2013.01); *H01J 2237/334* (2013.01)

(56) References Cited

U.S. PATENT DOCUMENTS

| | | | |
|---|---|---|---|
| 2013/0162142 A1 | 6/2013 | Nishino et al. |
| 2015/0064406 A1 | 3/2015 | Harada et al. |
| 2015/0126036 A1 | 5/2015 | Zhao |
| 2016/0332921 A1 | 11/2016 | Iwasawa et al. |
| 2017/0140902 A1 | 5/2017 | Simpson et al. |
| 2017/0152189 A1 | 6/2017 | Iwasawa |
| 2017/0283313 A1 | 10/2017 | Lee et al. |
| 2017/0292182 A1 | 10/2017 | Hamaya et al. |
| 2017/0323772 A1 | 11/2017 | Fenwick et al. |
| 2017/0370007 A1 | 12/2017 | Guchi et al. |
| 2018/0127319 A1 | 5/2018 | Ashizawa et al. |
| 2019/0203330 A1 | 7/2019 | Ibe et al. |
| 2019/0326101 A1 | 10/2019 | Ueda et al. |

FOREIGN PATENT DOCUMENTS

| | | | |
|---|---|---|---|
| JP | 2007100124 A | | 4/2007 |
| JP | 4006596 B2 | | 11/2007 |
| JP | 2013140950 A | | 7/2013 |
| JP | 2014141390 A | | 8/2014 |
| JP | 2016027624 A | | 2/2016 |
| JP | 2017150085 A | | 8/2017 |
| JP | 2017190475 A | | 10/2017 |
| JP | 2019192701 | * | 10/2019 |
| JP | 2019192701 A | | 10/2019 |

OTHER PUBLICATIONS

Office Action mailed Dec. 1, 2022 in U.S. Appl. No. 16/357,971.
Search Report mailed Mar. 31, 2020 in corresponding International Application No. PCT/JP2019/050252.
Written Opinion mailed Mar. 31, 2020 in corresponding International Application No. PCT/JP2019/050252.
Office Action mailed Mar. 18, 2021 in U.S. Appl. No. 16/357,971.

* cited by examiner

[FIG. 1]
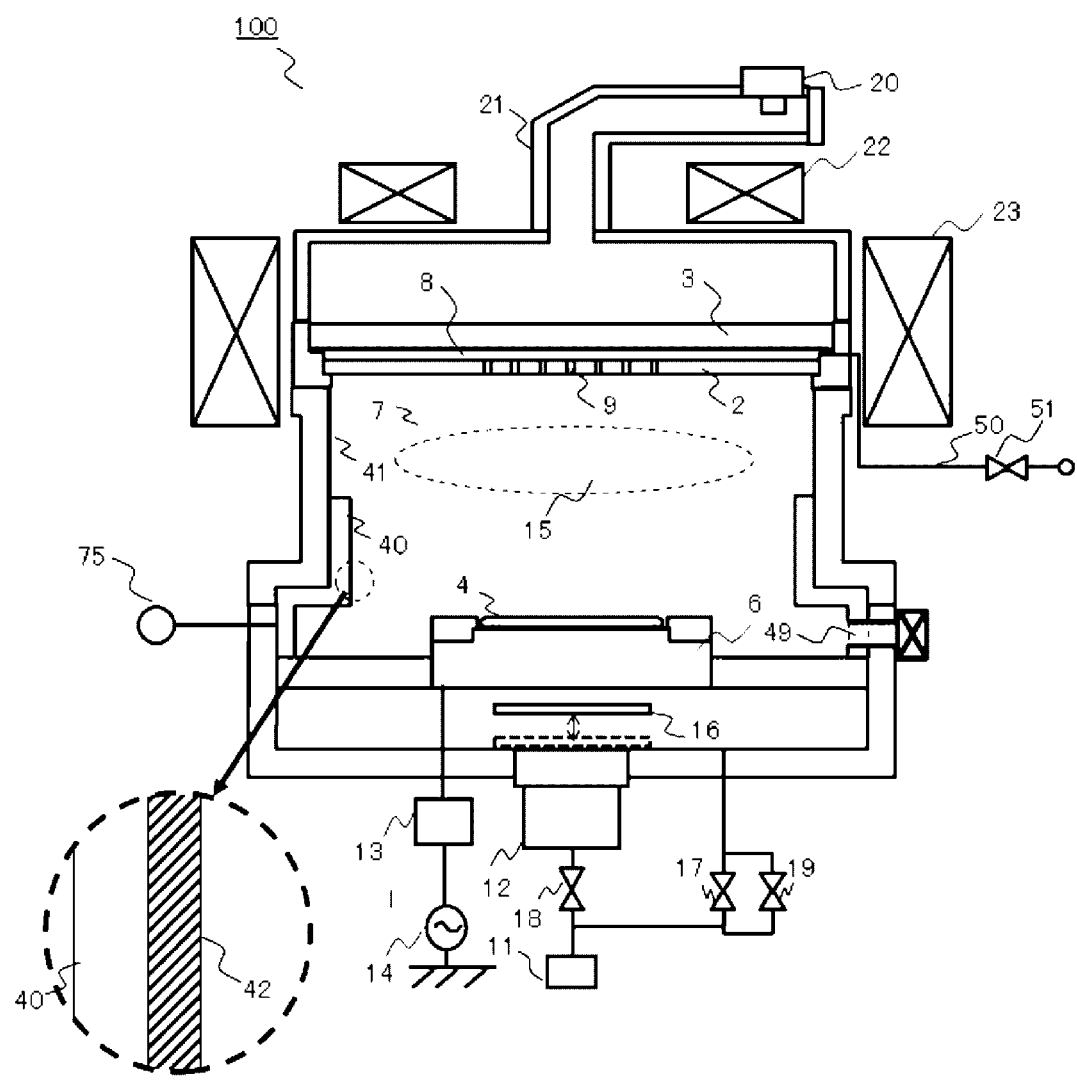

[FIG. 2]
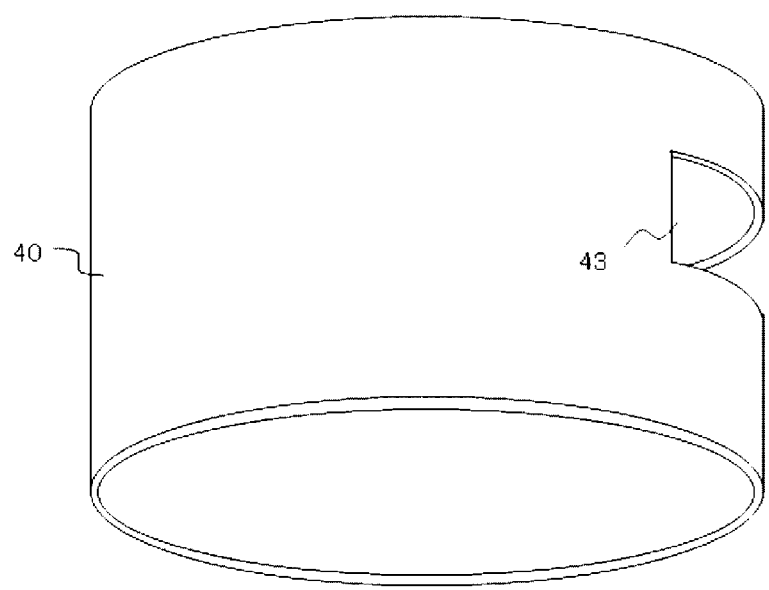

[FIG. 5]
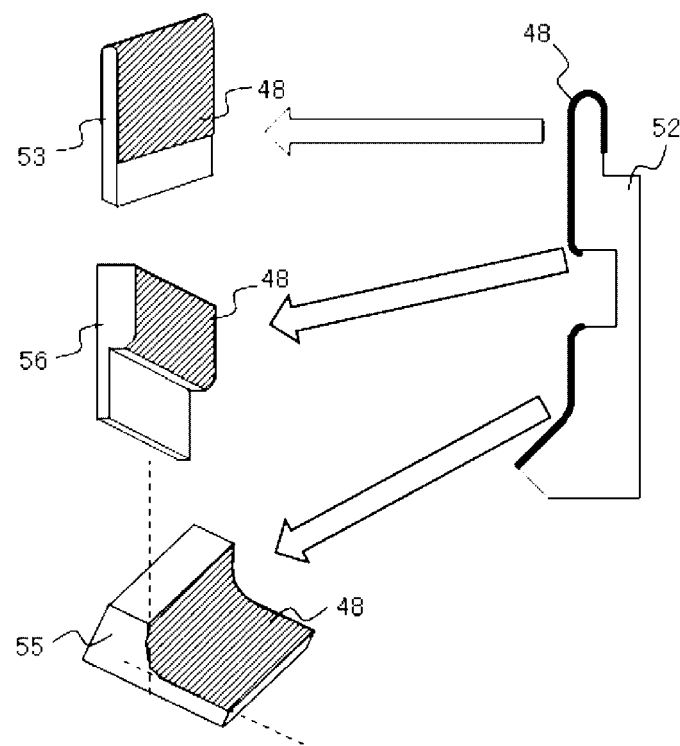

[FIG. 6]
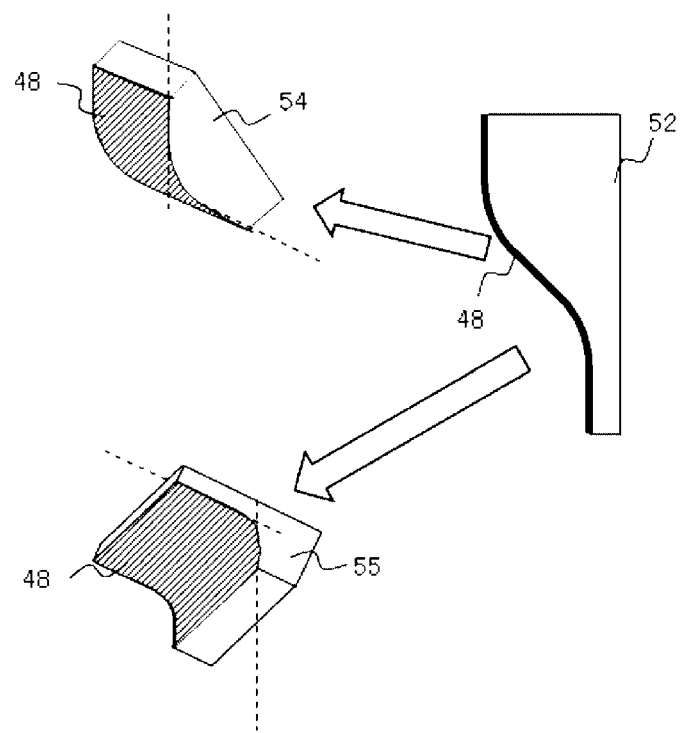

[FIG. 7]
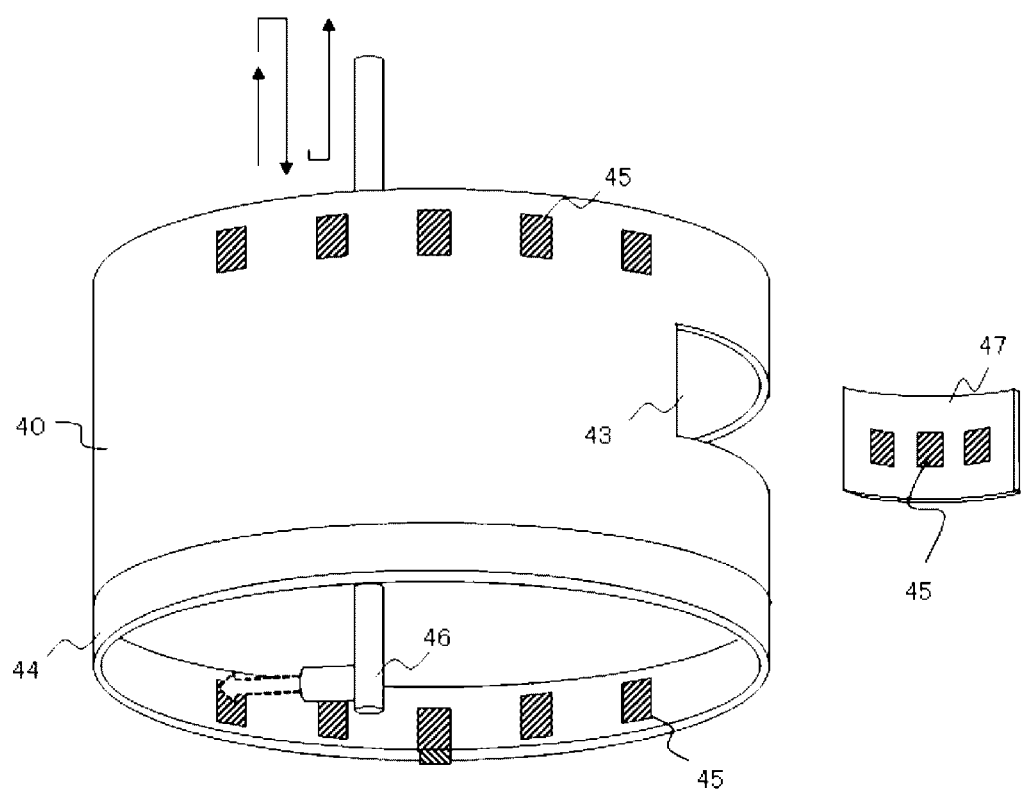

[FIG. 11]
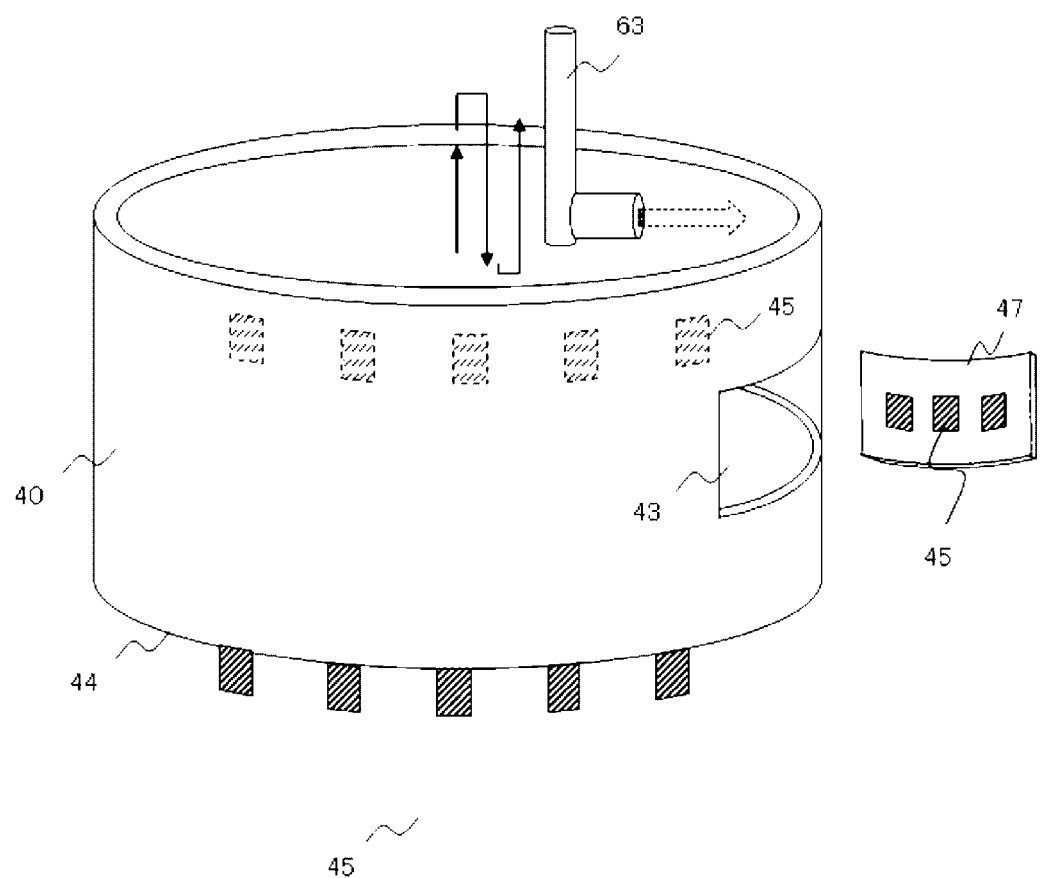

[FIG. 12]
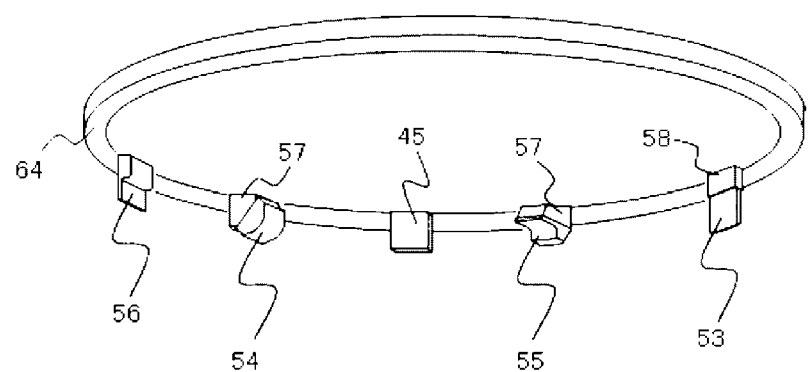

[FIG. 13]
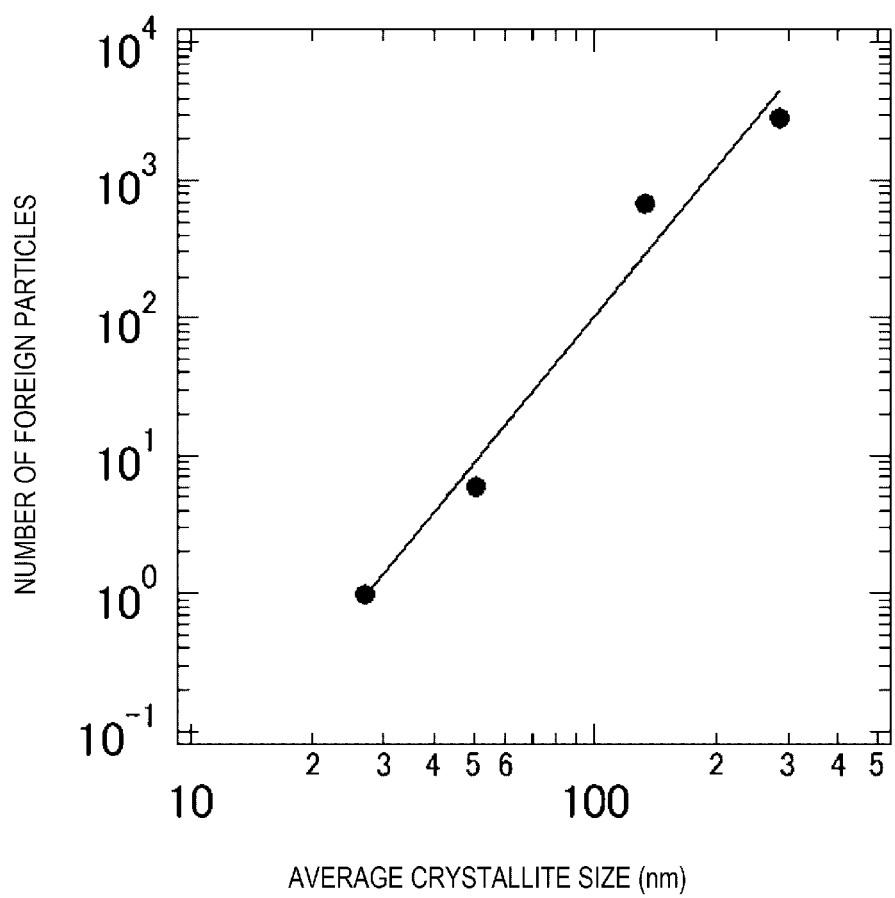

[FIG. 14]
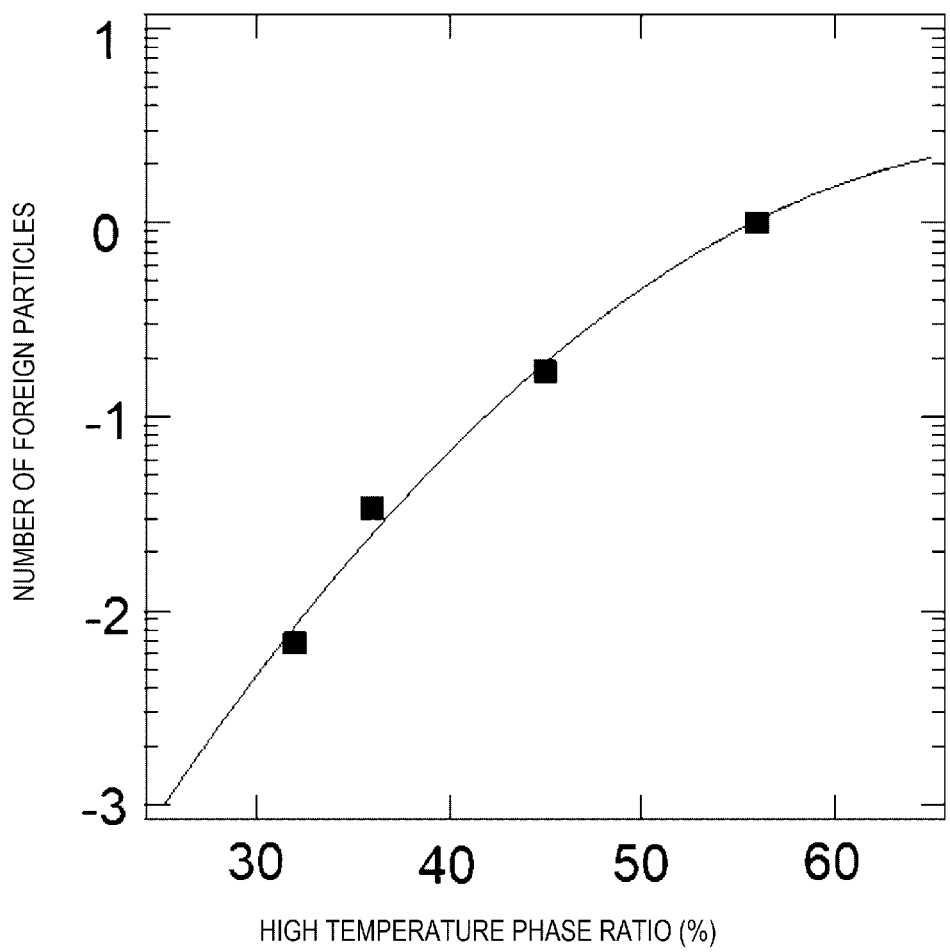

[FIG. 15]
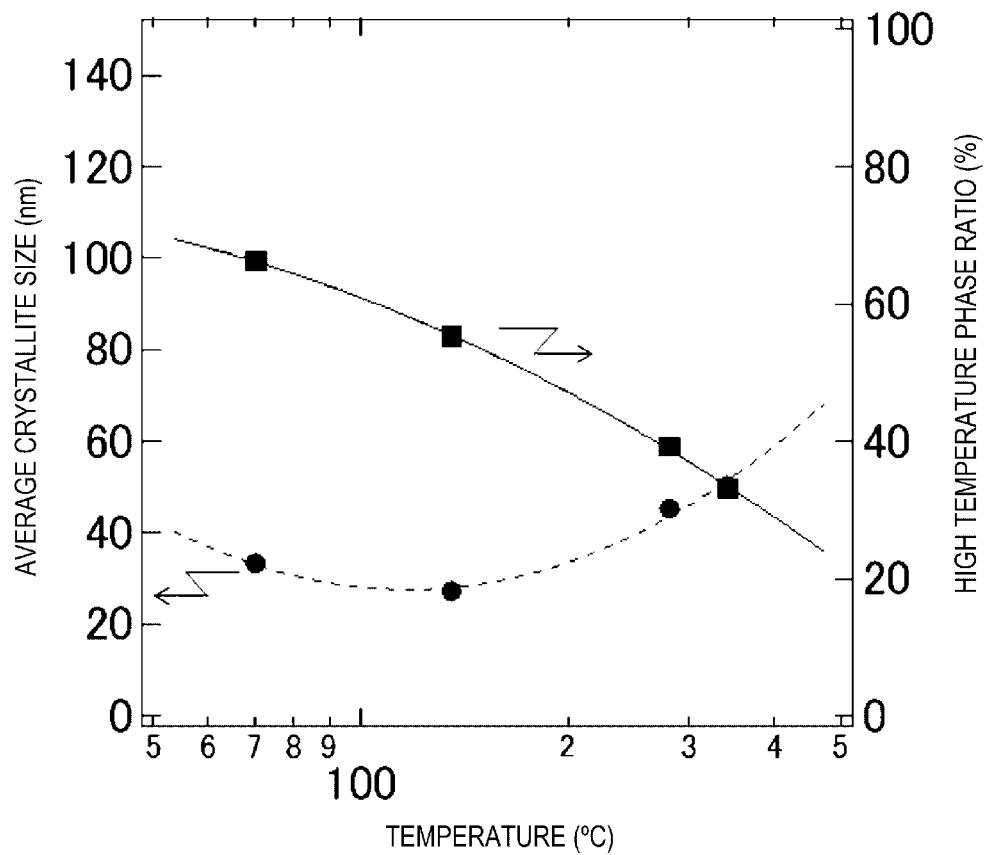

[FIG. 16]
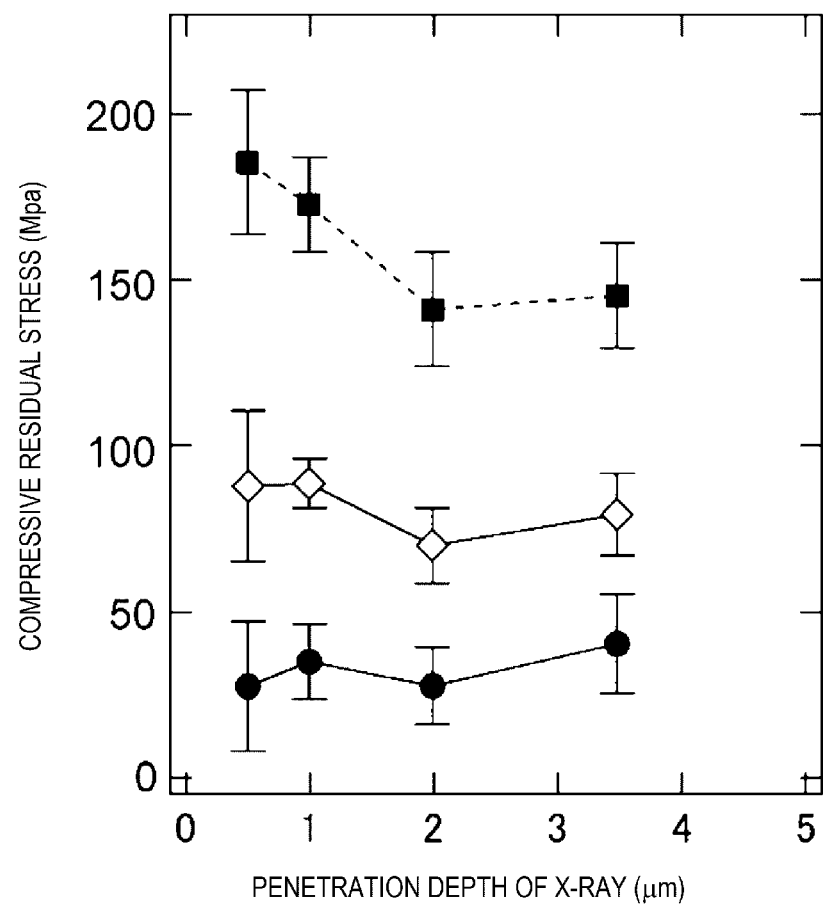

United States Patent US 11,987,880 B2

MANUFACTURING METHOD AND INSPECTION METHOD OF INTERIOR MEMBER OF PLASMA PROCESSING APPARATUS

TECHNICAL FIELD

The present invention relates to a manufacturing method and an inspection method of an interior member, which forms an interior of a processing chamber of a plasma processing apparatus for forming plasma in the processing chamber inside a vacuum container and processing a sample, such as a semiconductor wafer to be processed, which is disposed in the processing chamber, and the present invention relates to a manufacturing method and an inspection method of an interior member in which a film having plasma resistance is formed on a surface of the interior member forming an inner wall of the processing chamber.

BACKGROUND ART

Plasma etching is applied to microfabrication in manufacture of an electronic device and a magnetic memory. Processing accuracy required for the plasma etching is increasing year by year as devices are highly integrated. In order to improve yield of a plasma etching apparatus, it is necessary to reduce generation of foreign particles.

Since a processing chamber of a plasma processing apparatus used for the plasma etching is disposed inside a vacuum container, the processing chamber is made of metal such as aluminum or stainless steel. Since an inner wall surface of the processing chamber is exposed to plasma, a protective film having plasma resistance is formed on the surface. As such a protective film, a film made of yttrium oxide is generally used.

It is known in the related art that such a film containing yttrium oxide as a material is generally formed by using plasma spraying, SPS spraying, explosion spraying, low-pressure spraying, or the like. For example, in an atmospheric plasma spraying method, a technique is provided in which raw material powder with a size of 10 µm to 60 µm is introduced into a plasma flame together with a transport gas, and raw material particles in a molten or semi-molten state are jetted onto a surface of a base material to be adhered thereto to form a film. On the other hand, in the plasma spraying method, there are problems that surface irregularities are large, or many pores are formed inside the film, and particles that have entered these pores cause a reaction with the film and other members, which causes film consumption and corrosion.

Solutions to such problems have been studied in the related art. For example, when a film made of yttrium oxide is exposed to plasma of a fluorine-based gas, the film reacts with fluorine and the like in the plasma and vaporizes, so that the film is consumed. Therefore, a technique of forming a film by atmospheric plasma spraying using yttrium fluoride as a material is known in the related art. As such a technique, for example, one disclosed in JP-A-2013-140950 (PTL 1) is known in the related art.

On the other hand, when a pressure in the processing chamber is increased or decreased or a sample such as a semiconductor wafer is processed by forming plasma, a member disposed inside the processing chamber of the plasma processing apparatus faces the plasma and is repeatedly subjected to interaction such as heat, collision and adhesion of particles, or the like. It is required for interior members inside the processing chamber to keep the life of the interior members long by reducing damage and deterioration of the film as much as possible even under such an environment where conditions change. Therefore, in a process of manufacturing the interior members, it is necessary to inspect with higher accuracy whether a shape and performance are within a permissible range of an intended specification after the film is formed.

For example, because of the above problems, a surface of a member forming the inner wall inside the processing chamber of the plasma processing apparatus is protected by forming a film having excellent plasma resistance. However, as the required processing accuracy increases, a size of foreign particles generated inside the processing chamber also decreases, and it is required to reduce the generation thereof. Accordingly, in the related art, the film on the surface of the member forming the inner wall of the processing chamber is evaluated by detecting values of porosity, surface roughness (Ra), a crystallite size, a phase ratio, and the like of the film after the film is formed or after a post-treatment, and comparing the values with a permissible range of a predetermined specification. JP-A-2017-190475 (PTL 2) is known as an example of such a technique.

Further, when a film is formed by spraying on a plurality of surfaces of a certain type of member, in order to form a film having the same performance and characteristic such as a shape as possible by any one member and other members, a method has been known in the related art in which a part of a member is cut out and used for inspection, or one of a plurality of manufactured products is used for inspection. As an example of such a technique, one disclosed in JP-A-8-20858 (PTL 3) and JP-A-9-61318 (PTL 4) has been known.

CITATION LIST

Patent Literature

PTL 1: JP-A-2013-140950
PTL 2: JP-A-2017-190475
PTL 3: JP-A-8-20858
PTL 4: JP-A-9-61318

SUMMARY OF INVENTION

Technical Problem

However, the above-described techniques in the related art have a problem because the following points are not sufficiently taken into consideration.

That is, in a case where a film having plasma resistance or heat resistance is formed on the surface of the member that is disposed inside the processing chamber of the plasma processing apparatus and forms the inner wall thereof, generally, after conditions such as an operation of an apparatus for forming a film and a film forming rate are set, a film is formed and a post-treatment is further performed. However, in a technique in the related art, after the film on the surface of the internal member is formed, the film is not evaluated by comparing the characteristics such as the porosity, the surface roughness (Ra refers to arithmetic mean roughness), the crystallite size, and the phase ratio of the film with the predetermined permissible range, and, for example, the inspection of the member is limited to visual inspection. On the other hand, since the inner wall of the processing chamber has irregularities, openings, and end portions, it is not clear whether the film formed on the surface of the member forming the inner wall has desired characteristics and performance (such as the porosity, the surface roughness, a residual stress, the crystallite size, and the phase ratio) at portions where respective members are disposed.

As in PTL 3, in a case where a part of the member inside the processing chamber is cut out and the above inspection is performed, it is necessary to, for example, wash the part after the part of the member to be inspected is cut from the member. Therefore, the film of the part to be inspected may not be formed in the same process as that of other members of the same type, and in a cutting step, foreign particles may be generated on a surface of the film to be inspected, and the accuracy of the inspection may be impaired.

Further, as in PTL 4, for a plurality of members of one type that form the inner wall of the processing chamber, a film is formed under the same predetermined conditions and specifications, and one of the members is used for inspection. A dimension of the member increases, and especially in a case of a structure in which one member forms a main part of an entire inner wall portion of the processing chamber, such as plasma processing apparatuses in recent years, a unit price of the member may be large and manufacturing cost of the plasma processing apparatus may be significantly increased due to the inspection. As described above, in the techniques of the related art, in the plasma processing apparatus, the performance of the film of the member that is disposed inside the processing chamber and forms the inner wall, that is the performance of the plasma processing apparatus greatly varies, and reliability of the plasma processing apparatus and processing yield are impaired. Further, no consideration is given to the problem that the manufacturing cost is increased.

An object of the invention is to provide a manufacturing method and an inspection method of an interior member of a plasma processing apparatus which has improved processing yield and reliability.

Solution to Problem

The above object is achieved by providing a manufacturing method of an interior member which is arranged inside a processing chamber disposed inside a vacuum container of a plasma processing apparatus configured to process a wafer by using plasma formed in the processing chamber, and which includes, on a surface of the interior member, a first film of a material having resistance to the plasma. The manufacturing method includes: a step of forming the first film by spraying the material onto the surface of the interior member by moving a gun by a predetermined distance along the surface of the interior member, and forming a second film by spraying the material on a surface of a test piece which has a shape simulating a surface shape of the interior member and which is disposed within a range of the predetermined distance, by moving the gun within the predetermined distance; and a step of adjusting a condition of forming the first film on the surface of the interior member by the gun, based on a result of detecting at least one of a crystal size of the second film on the surface of the test piece, a residual stress, and a contaminant element.

More specifically, in parallel with a step of forming a film on an inner wall surface around a central axis of a cylindrical or ring-shaped ground electrode, which is disposed inside the vacuum container in the plasma processing apparatus and forms the inner wall surface of the processing chamber where plasma is formed in an inner space, by moving a film-forming gun along a direction along the central axis and a predetermined path around the axis, a film is also formed on a test piece on a surface of one or more test pieces disposed on the path for movement of the gun, such as an upper end or an end portion of a lower end of the ground electrode, an opening of the ground electrode, and the like. Further, the quality of the ground electrode is determined based on a result of inspecting a predetermined item of the film on the surface of the test piece. A shape of the test piece has (1) the same shape as an end portion of the opening, and has a film boundary portion with a film on a first surface but no film on a second surface, has (2) the same shape as an inclined surface where a spray direction of the film-forming gun is not perpendicular to the surface of the ground electrode, and has (3) an end portion on which a film is formed on an inner peripheral surface-an end tip portion-an outer peripheral surface as an end portion of the ground electrode. (4) One of the test pieces has the above-described shapes (1) to (3).

Advantageous Effect

According to the invention, a manufacturing method and an inspection method of an interior member of a plasma processing apparatus, which has improved processing yield and reliability, are provided.

BRIEF DESCRIPTION OF DRAWINGS

FIG. 1 is a longitudinal cross-sectional view schematically showing an outline of a configuration of a plasma processing apparatus according to an embodiment of the invention.

FIG. 2 is a perspective view schematically showing an outline of a configuration of an interior member forming a ground electrode shown in FIG. 1.

FIG. 5 is a perspective view schematically showing outlines of shapes of test pieces formed by dividing the test piece according to the embodiment shown in FIG. 3B.

FIG. 6 is a perspective view schematically showing outlines of shapes of test pieces formed by dividing the test piece according to the embodiment shown in FIG. 4B.

FIG. 7 is a perspective view schematically showing a state where the ground electrode and the test pieces shown in FIGS. 3 to 6 are disposed in a step of forming a film on an inner side wall of the ground electrode according to the present embodiment shown in FIG. 2.

FIG. 11 is a perspective view schematically showing a state where test pieces are mounted in a step of forming a film on an inner side wall of a ground electrode according to another modification of the embodiment shown in FIG. 7.

FIG. 12 is a perspective view schematically showing a state where the test pieces according to the modification shown in FIG. 11 are mounted on a test piece installation jig.

FIG. 13 is a graph showing a correlation between an average crystallite size and the number of generated foreign particles of a film on an inspection surface of the test piece according to the present embodiment shown in FIGS. 3A and 3B.

FIG. 14 is a graph showing a correlation between a hexagonal crystal phase ratio and the number of generated foreign particles of the film on the inspection surface of the test piece according to the present embodiment shown in FIGS. 3A and 3B.

FIG. 15 is a graph showing changes in the average crystallite size and the hexagonal crystal phase ratio of the film with respect to a temperature change of a base material when the film is formed on the inspection surface of the test piece shown in FIGS. 3A and 3B.

FIG. 16 is a graph showing a correlation between a film on the inspection surface of the test piece in which the number of generated foreign particles differs and a depth distribution of a residual stress according to the embodiment of FIGS. 3A and 3B.

DESCRIPTION OF EMBODIMENTS

Figure 3A:
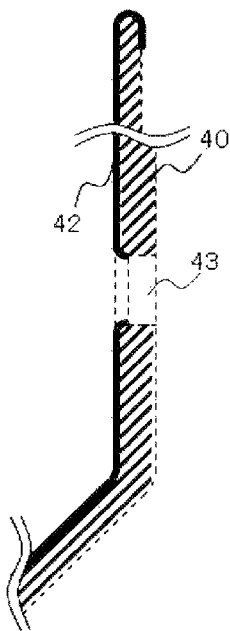
FIGS. 3A and 3B are cross-sectional views schematically showing a part of the ring-shaped ground electrode shown in FIG. 2 and a shape of a longitudinal cross section along a central axis in an up-down direction of a test piece having a surface shape similar to the part.

Embodiments of the invention will be described with reference to FIGS. 1 to 16.

Embodiment 1

FIG. 1 is a longitudinal cross-sectional view schematically showing an outline of a configuration of a plasma processing apparatus according to an embodiment of the invention. The plasma processing apparatus shown in this figure is a plasma etching apparatus that forms plasma in a processing chamber inside a vacuum container, and performs etching processing by using the plasma on a film structure, which has a mask layer previously formed on a surface of a sample such as a semiconductor wafer placed in the processing chamber and a film layer to be processed below the mask layer.

A plasma processing apparatus 100 of the embodiment shown in FIG. 1 roughly includes: a metal vacuum container 1 a part of which has a cylindrical shape; a plasma forming unit which is disposed above the vacuum container 1, includes a generator that generates an electric field or a magnetic field for forming plasma in a depressurized space inside the vacuum container 1, and supplies the generated electric field or magnetic field to the internal space; and an exhaust unit which includes a vacuum pump that is disposed under the vacuum container 1 and is connected to the vacuum container 1 to exhaust the space inside the vacuum container 1 to reduce a pressure. Further, the vacuum container 1 is connected to a transfer container whose outer side wall is another vacuum container 1 and in which a wafer, which is a sample to be processed, is transferred in a depressurized internal transfer space. A side wall of the vacuum container 1 is provided with a gate, which is a passage that penetrates the side wall in a horizontal direction and connects the inside and the outside of the vacuum container 1, and through which the wafer is transferred to the inside. The transfer container is connected to a position of the side wall of the vacuum container 1 surrounding an outer periphery of an opening on an outer side of the gate, and the space inside the vacuum container 1 and the space inside the transfer container can communicate with each other.

The vacuum container 1 includes a processing chamber 7 which has a space in which the sample to be processed is disposed and plasma is formed. The processing chamber 7 is provided with a discharge unit which is disposed on an upper part, has a cylindrical shape, and in which plasma 15 is formed, and a stage 6 which is a sample stage having a cylindrical shape and is disposed in a lower space connected to the discharge unit. The stage 6 has a circular upper surface which is a surface on which a wafer 4 that is a substrate to be processed is placed. Inside the stage 6, a heater for heating the wafer 4 and a cooling medium passage through which a cooled cooling medium flows are disposed. A pipe for supplying a helium (He) gas, which is a heat transfer gas, is provided between the circular upper surface of the stage 6 and a back surface of the wafer 4 placed on the upper surface.

Further, a metal electrode is disposed inside the stage 6, and a high frequency power supply 14, which supplies, to the electrode, a high frequency power for forming a potential on the wafer 4 during processing of the wafer 4 using the plasma 15, is electrically connected to the electrode via an impedance matching device 13. Charged particles such as ions inside the wafer 4 are attracted to a surface of the wafer 4 due to a potential difference between plasma and a bias potential formed on the wafer 4 by the high frequency power during the formation of the plasma 15, and etching processing is facilitated. In the present embodiment, a metal base material having a cylindrical or disk shape is disposed inside the stage 6, the base material is connected to the high frequency power source 4, the heater and the cooling medium passage are disposed inside the base material, and the pipe for supplying the He gas is disposed so as to penetrate the base material.

The wafer 4 is placed on a tip end portion of an arm of a transfer apparatus (not shown) such as a robot arm disposed in the transfer space inside the transfer container, and is transferred to the processing chamber 7, and then placed on the stage 6. An electrode (not shown) for electrostatically adsorbing the wafer 4 by being supplied with a direct current power is disposed inside a dielectric film, which is disposed so as to form a placing surface of the wafer 4 of the stage 6 and to cover an upper surface of the base material. The wafer 4 placed on the stage 6 is adsorbed and held on the upper surface of the dielectric film due to an electrostatic force generated by applying a direct current voltage to the electrode for electrostatic adsorption. Further, in this state, the He gas is supplied to a gap between the back surface of the wafer 4 and the upper surface of the dielectric film, which is the placing surface of the stage 6, through the pipe inside the base material, and heat transfer between the wafer 4 and the cooling medium flowing in the cooling medium passage inside the base material is facilitated, so that a temperature of the wafer 4 is adjusted.

Above an upper end portion of the cylindrical side wall member surrounding the discharge unit of the vacuum container 1, a shower plate 2 and a window member 3 each having a disk shape are placed with a ring-shaped member interposed therebetween. The window member 3 and a side wall member 41 on an outer periphery of the discharge unit form the vacuum container 1. Seal members such as O-rings are interposed between a lower surface of an outer peripheral edge portion and the ring-shaped member, that is disposed between the lower surface and an upper surface of the upper end portion of the side wall member, and between the ring-shaped member and the lower surface, and these members are connected. The processing chamber 7 inside the vacuum container 1 and the outside atmosphere at an atmospheric pressure are airtightly partitioned.

As will be described later, the window member 3 is a disk-shaped member made of ceramics (quartz in the present embodiment) through which an electric field of microwaves for forming the plasma 15 is transmitted. The shower plate 2 having a plurality of through holes 9 in a central portion thereof is disposed below the window member 3 with a gap 8 having a predetermined size. The shower plate 2 faces the inside of the processing chamber 7 to form a ceiling surface thereof, and a processing gas, whose flow rate is adjusted to a predetermined value by a gas flow rate control unit (not shown), is introduced into the gap 8. The processing gas diffuses in the gap 8 and then is introduced into the processing chamber 7 through the through holes from above. The processing gas is introduced into the gap 8 by opening a valve 51 disposed on a processing gas supply pipe 50 connected to the ring-shaped member.

Further, a bottom of the vacuum container 1 has a passage, which connects the inside and the outside of the processing chamber 7, and through which the plasma 15 inside the processing chamber 7, products generated during the processing of the wafer 4, and particles of the processing gas are discharged. A circular opening of the passage on an inner side of the processing chamber 7 is disposed, as an exhaust port, at a position immediately below the stage 6, which is disposed above, such that central axes can be regarded as the same when viewed from above. A turbo molecular pump 12 forming the vacuum pump of the exhaust unit and a dry pump 11 disposed downstream of the turbo molecular pump 12 are connected to a bottom surface of the vacuum container 1. Further, an inlet of the turbo molecular pump 12 is connected to the exhaust port by an exhaust pipe.

A valve 18 is disposed on the exhaust pipe for connecting the turbo molecular pump 12 and the dry pump 11. Another exhaust pipe 10, which is connected to the bottom surface of the vacuum container 1 and is connected to the bottom of the processing chamber 7, is connected to a portion of the exhaust pipe between the valve 18 and the dry pump 11. The exhaust pipe 10 is connected so as to be branched into two pipes on the way and then merge again into one pipe, and valves 17, 19 are disposed on the branched portions, respectively. The valve 17 in the valves 17, 19 is a slow exhaust valve for slowly exhausting the processing chamber 7 from the atmospheric pressure to the vacuum by the dry pump 11, and the valve 19 is a main exhaust valve for exhausting by the dry pump 11 at a high speed.

The processing chamber 7 is provided with a pressure sensor 75 for detecting a pressure inside the processing chamber 7. In a space at a lower portion of the processing chamber 7, between a bottom surface of the stage 6 and the processing chamber 7, and above the exhaust port of the present embodiment, a disk-shaped pressure adjusting plate 16 is disposed which moves in the up-down direction in the space to open and close the exhaust port and increase or decrease an opening area of the exhaust port so as to adjust a flow rate or a speed of an exhaust gas. The pressure in the processing chamber 7 is increased or decreased depending on balance in flow rate or speed of the processing gas or another gas introduced into the processing chamber 7 through gas introduction ports, which are the through holes of the shower plate 2, and the exhaust gas from the exhaust port. For example, the gas is introduced into the processing chamber 7 from the shower plate 2 at a flow rate or a speed set to a predetermined value corresponding to processing conditions of the wafer 4, and the flow rate or the speed of the exhaust gas is adjusted to realize the pressure in the processing chamber 7 corresponding to the processing conditions by adjusting a position of the pressure adjusting plate 16 in the up-down direction.

The plasma forming unit is disposed above a metal side wall surrounding the outer periphery of the discharge unit of the processing chamber 7 on an upper portion of the vacuum container 1 and the window member 3 at a portion of an outer peripheral side of the window member 3. The plasma forming unit has a magnetron oscillator 20 that outputs the electric field of the microwaves for forming the plasma 15, and a waveguide 21 for propagating the microwaves to the processing chamber 7. The waveguide 21 has a square portion, which extends in the horizontal direction (left-right direction in the figure) and has a rectangular or square cross section, and a circular portion having a cylindrical shape, which is connected to one end portion of the square portion and extends in the up-down direction. The magnetron oscillator 20 is disposed at the other end portion of the square portion.

A lower end of the circular portion is connected to an upper end of a cylindrical hollow portion, which is disposed above the window member 3 and has a diameter approximately similar to that of the window member 3 and larger than a diameter of the circular portion. Further, a ring-shaped solenoid coil 22 and solenoid coil 23, which are units to be supplied with direct current power to generate a magnetic field, are provided above the hollow portion and at a position surrounding the discharge unit of the processing chamber 7 on an outer peripheral side of the side wall of the vacuum container 1 surrounding an outer peripheral side of the hollow portion and the discharge unit.

An inner side wall surface of the side wall member 41 of the processing chamber 7 is a surface exposed to the plasma 15 formed in the discharge unit, but an interior member is required that functions as a ground in the processing chamber 7 in order to stabilize the potential of the plasma 15. In the present embodiment, a ring-shaped ground electrode 40 that functions as a ground in the discharge unit is disposed above the stage 6 so as to surround the upper surface of the stage 6. The ground electrode 40 is made of a metal member, such as a stainless alloy or an aluminum alloy, as a base material. Since the ground electrode 40 is exposed to the plasma 15, the ground electrode 40 interacts with highly reactive and corrosive particles in the plasma 15. Therefore, there is a high possibility that a generated product will be a source of corrosion, metal contamination, and generation of foreign particles.

Therefore, in order to reduce such a problem, as shown schematically in a cross-sectional view enlarged in a lower left part of FIG. 1, an inner wall material film 42 made of a material having high plasma resistance is disposed on a surface of the ground electrode 40 of the present embodiment so as to cover the surface. By covering the surface using the inner wall material film 42, the ground electrode 40 can reduce damage such as corrosion to the ground electrode 40 caused by the plasma while maintaining the function as ground. The film 42 may be a laminated film.

On the other hand, although the side wall member 41 surrounding the discharge unit of the vacuum container 1 of the present embodiment is made of a metal base material such as a stainless alloy or an aluminum alloy, the side wall member 41 does not function as a ground. In order to reduce the generation of the corrosion, the metal contamination, and the foreign particles caused by the side wall member 41 being exposed to the plasma 15, an inner surface of the side wall member 41 is subjected to a surface treatment such as a passivation treatment, thermal spraying, PVD, and CVD. Further, in order to prevent a base material of the side wall member 41 from being directly exposed to the plasma 15, a ring-shaped or cylindrical-shaped interior member made of ceramics such as yttrium oxide or quartz may be disposed between an inner side wall surface of the side wall member 41 having a cylindrical shape and the discharge unit of the processing chamber 7 and along the inner side wall surface so as to cover the inner side wall surface with respect to the plasma 15. The interior member between the side wall member 41 and the plasma 15 prevents contact between the side wall member 41 and the plasma 15 and reduces consumption of the surface-treated side wall member 41 caused by the plasma 15.

When the wafer 4, which is placed on the tip end portion of the arm of the robot arm and is transferred from the transfer space (transfer chamber) inside the transfer container into the processing chamber 7 through a gate 49 on the side wall of the vacuum container 1, is placed on a placing surface of the stage 6, and the robot arm moves out of the processing chamber 7, an opening of the gate 49 is airtightly closed by a gate valve 50 disposed on an outer side of the vacuum container 1 to seal the inside of the processing chamber 7. When the wafer 4 is electrostatically adsorbed and held on the placing surface of the stage 6, the processing gas is introduced from the shower plate 2, an amount of the exhaust gas from the exhaust port is adjusted by an operation of the pressure adjusting plate 16, and the pressure in the processing chamber 7 is set to a predetermined pressure suitable for processing.

The electric field of the microwaves oscillated from the magnetron oscillator 20 propagates through the waveguide 21 and is radiated into the processing chamber 7 through the quartz window member 3 and the quartz shower plate 2 below the window member 3. Electron cyclotron resonance (ECR) is formed by the interaction between the electric field of microwaves and the magnetic field generated by the solenoid coils 22, 23, atoms or molecules of the processing gas introduced into the processing chamber 7 from the gas introduction ports of the shower plate 2 are excited, ionized, and dissociated, and the plasma 15 is generated in the discharge unit.

When the plasma 15 is formed, the high frequency power is supplied from the high frequency power supply 14 to the base material of the stage 6, the bias potential due to the high frequency power is formed on the wafer 4, and the etching processing of the film layer to be processed is started according to a processing pattern of the mask layer having the film structure formed on the wafer 4. When an end point of the etching processing or reaching of a predetermined remaining film thickness is detected by an end point detector (not shown) for processing, the supply of the high frequency power, the microwave electric field, and the magnetic field are stopped, the plasma is extinguished, and the etching processing is completed. Further, after the supply of the processing gas is stopped, exhaust (high vacuum exhaust) processing is performed until the inside of the processing chamber 7 reaches a high degree of vacuum.

FIG. 2 is a perspective view schematically showing an outline of a configuration of an interior member forming the ground electrode shown in FIG. 1. FIG. 2 shows a diagram of the ground electrode 40 having the ring shape or the cylindrical shape shown in FIG. 1 as viewed obliquely from below to above.

As shown in the figure, the ground electrode 40 is provided with the cylindrical shape having a predetermined thickness as a whole, and has an inner side wall and an outer side wall each having an inner diameter of the same value around a central axis in the up-down direction. Further, the ground electrode 40 has a cylindrical main side wall portion and a ring-shaped electrode portion disposed further above an upper end of the main side wall portion, and an outer peripheral wall surface of the electrode portion at a radial position from the central axis in the up-down direction is smaller than that of the lower main side wall portion. A rectangular opening 43 of a through hole forming the gate 49 is disposed in a middle portion in the up-down direction of the cylindrical main side wall portion.

In a state where the ground electrode 40 is mounted inside the processing chamber 7, the ground electrode 40 is disposed between the inner side wall and the processing chamber 7, and the ground electrode 40 has a length in the up-down direction enough to cover the inner side wall surface of the side wall member 41 of the vacuum container 1 with respect to the plasma 15 such that a lower portion of the ground electrode 40 is disposed on the outer peripheral side of the stage 6 and on an inner side of the side wall member 41 surrounding the stage 6, and an upper portion of the ground electrode 40 is disposed on the inner side of the side wall member 41 surrounding the discharge unit. This shape protects the side wall member 41 from the interaction of the plasma 15.

Further, the side wall member 41 having the cylindrical shape of the vacuum container 1 matches a shape in which an inner diameter of the upper portion is smaller than that of the lower portion in an up-down axial direction. An outer diameter of the electrode portion, which forms the upper portion of the ground electrode 40 and covers an inner surface of the inner side wall of the upper portion of the side wall member 41 surrounding the discharge unit with respect to the plasma 15 is disposed closer to a center side than an outer shape of the lower main side wall portion, in other words, a small diameter portion is formed. Further, as described later, the ground electrode 40 has a step portion between the upper electrode portion and the lower main side wall portion, and a surface of the inner side wall has a shape recessed toward the outer peripheral side as the surface goes downward from above along the central axis. From this point, it can be said that the ground electrode 40 has a large diameter portion at a lower portion thereof.

Figure 3B:
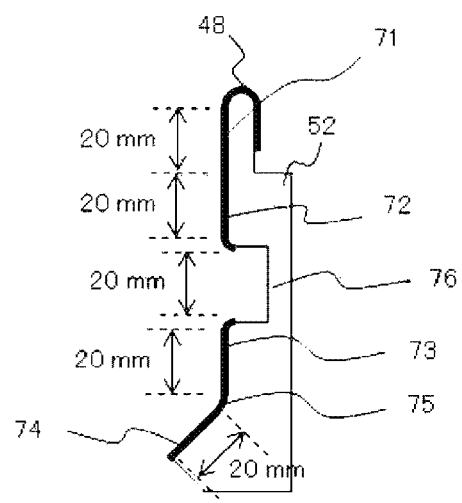
Figure 4A:
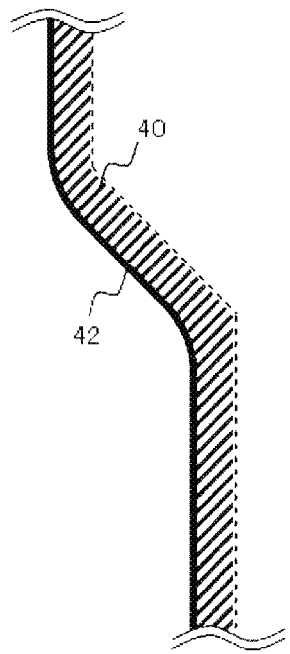
FIGS. 4A and 4B are cross-sectional views schematically showing a part of the ring-shaped ground electrode shown in FIG. 2 and a shape of a longitudinal cross section along a central axis in an up-down direction of a test piece having a surface shape similar to the part.
Figure 4B:
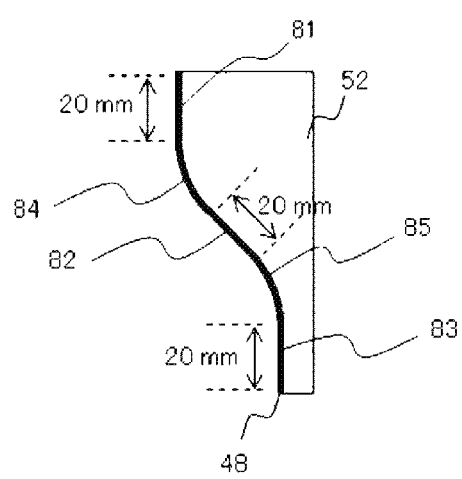

A shape of a part of the ground electrode 40 shown in FIG. 2 and a configuration of a test piece having a similar shape corresponding to the part will be described with reference to FIGS. 3A to 4B. FIGS. 3A, 3B, 4A, and 4B are cross-sectional views schematically showing parts of the ring-shaped ground electrode shown in FIG. 2 and shapes of longitudinal cross sections along the central axis in the up-down direction of test pieces having surface shapes similar to the parts. Each of the FIGS. 3A and 4A is a diagram showing a cross-sectional shape of the part of the ground electrode 40, and the FIGS. 3B and 4B are diagrams showing cross-sectional shapes of test pieces 52a, 52b each having a surface shape similar to the shape of the part of the ground electrode 40 shown in FIGS. 3A and 4A.

As described above, the ground electrode 40 of the present embodiment has the base material made of an aluminum alloy and the film 42 having the plasma resistance on the surface thereof. Further, in a state where the ground electrode 40 is disposed inside the processing chamber 7, the inner side wall surface and the upper end portion of the ring-shaped electrode portion on the upper portion of the ground electrode 40 are portions facing the plasma 15 when the plasma 15 is formed in the discharge unit. Since the plasma 15 may enter a gap between the electrode portion and the side wall member 41 and wrap around an outer side wall surface of the electrode portion, the film 42 is also disposed at a portion extending from the upper end portion of the electrode portion to the outer side wall surface so as to cover the portion. On the other hand, in a state where the ground electrode 40 is mounted inside the processing chamber 7, since a lower end portion of the ground electrode 40 is located below the upper surface of the stage 6 and disposed apart from the plasma 15, the film 42 is not disposed on the outer side wall surface.

Next, the test piece used in a step of manufacturing the ground electrode 40 of the present embodiment will be described. The test piece of the present embodiment has a mounting surface that comes into contact with a jig when the test piece is mounted on the jig, and a film target surface 48 that is an inspection surface on an opposite side to the mounting surface and on which a film used for inspection is formed. An inspection surface 48 has a shape similar to a shape of a part of an inner wall surface of the ring-shaped ground electrode 40 shown in FIG. 2. In particular, a flat surface forming a part of the inspection surface 48 and a curved surface connected to the flat surface have a cross-sectional shape similar to a shape of a cross section along a rotation axis of the ground electrode 40. In a manufacturing method according to the present embodiment, such a test piece is disposed adjacent to the ground electrode 40 during a step of forming the film 42 on the surface of the ground electrode 40, and in parallel with the formation of the film 42 on the surface of the base material of the ground electrode 40, the test film 42 is formed on the inspection surface 48 of the test piece under the same conditions as the case of the forming of the film 42.

A test piece 52 of the present embodiment includes a plurality of plane portions corresponding to a part of shapes of cylindrical and conical side walls having a central axis in the up-down direction on the inner wall surface of the ground electrode 40, and at least one curved surface connected between two upper and lower plane portions among these planes. That is, the test piece 52a has a shape similar to a shape of an inner wall surface of a portion including the upper electrode portion and the opening 43 of the ground electrode 40 shown in FIG. 3A, as the inspection surface 48 on a surface of the test piece 52a shown in FIG. 3B on a left side in the figure.

Above the opening 43 of the electrode portion of the ground electrode 40 shown in FIG. 3A, a portion where the surface has a cylindrical shape at the same radial position from the central axis is a portion whose longitudinal cross section is a straight line in the up-down direction. The test piece 52a has a shape similar to these portions on a side wall surface, which is a film target surface, on the left side in the figure, and has two flat surfaces 71, 72, which are connected to each other and have a width of 20 mm in the up-down direction, on the upper portion.

Further, a portion below the opening 43 shown in FIG. 3A of the ground electrode 40 is a portion having a shape of the cylindrical side wall surface whose surface is at the same radial position from the central axis, and of a conical side wall which is on a lower side of the above portion, and whose radius decreases toward the central axis side of the cylinder as going downward. That is, the ground electrode 40 has a shape that extends as a straight line by changing a direction from a linear portion in the up-down direction to a center side (left side in the figure) as a line showing the inner wall surface of the longitudinal cross section goes downward. The test piece 52a shown in FIG. 3B has, as a portion of the inspection surface 48 corresponding to the shape of the lower portion of the ground electrode 40 shown in FIG. 3A, two flat surfaces 73, 74, which are on an upper side and a lower side respectively and each of which has a width of 20 mm in the up-down direction. The lower flat surface 74 forms an inclined surface so as to project toward a front side (left side in the figure) as the flat surface 74 goes downward when viewed from the left side in the figure.

In the test piece 52a of the example, since a portion of a mounting surface on an opposite side (right side in the figure) of the inclined surface 74 is a vertical surface that is not inclined in the up-down direction in the figure, a lower portion of the test piece 52a including the surface 74 has a taper shape in which a thickness of the member in a left-right direction in the figure monotonically increases as going downward. A curved surface 75, that is, a curved surface having a central axis in a horizontal direction (a direction perpendicular to the figure in the figure) and having the same shape as a part of the cylindrical side wall having a predetermined radius R in the up-down direction, is disposed between the surfaces 73, 74. The curved surface 75 has a radius of curvature of 200 mm, and forms the inspection surface 48. Upper and lower end portions of the curved surface 75 smoothly connect a lower end portion of the surface 73 and an upper end portion of the surface 74.

The opening 43 of the ground electrode 40 is difficult to handle when the test piece has a through hole. Therefore, the test piece 52a has, at a middle section in the up-down direction, a recessed portion 76 whose depth is the same as a thickness of the main side wall portion of the ground electrode 40 in the opening 43 and whose opening shape is the same rectangular shape as the opening 43. An inner surface of the recessed portion 76 excluding an edge portion of the opening of the recessed portion 76 does not form the inspection surface 48, and the film 42 is not formed thereon, but the edge portion of the opening is chamfered so as to be a surface inclined with respect to a surrounding surface, or has a curved shape and forms the inspection surface 48.

As will be described later, the film 42 is disposed on the inspection surfaces 71 to 75 of the test piece 52a such that the same material as the film 42 is used to form the same thickness under the same conditions. As will be described later, the formation of the film 42 on the inspection surface 48 is performed by disposing the ground electrode 40 and the test piece 52a adjacent to each other and using a device for forming the same film in parallel on the inner wall surface of the ground electrode 40 and the inspection surface of the test piece 52a in the step of forming the film 42 on the surface of the ground electrode 40.

At an upper end portion of the test piece 52a, as a portion corresponding to the inner side wall surface and the outer side wall surface of the electrode portion of the ground electrode 40, an upper end surface and the lower inspection surface 48 connected to the upper end surface and both surfaces on the mounting surface side (these surfaces) form the inspection surface 48. The inspection surface is disposed on the outer side wall surface from a tip end of the upper end portion to a position of 10 mm on the lower flat surface, and the film 42 is formed.

FIG. 4A shows a shape of an inner wall surface of a portion below the part of the ground electrode 40 shown in FIG. 3A. Similarly to FIG. 3A, the portion shown in this figure also has a plurality of portions, whose surface has a shape of a cylindrical side wall surface, in the up-down direction, but a radius of the cylindrical side wall surface of the lower portion is larger than that of the upper portion. It is different from FIG. 3A in that a portion whose surface has a shape of a truncated cone-shaped side wall surface is provided between these upper and lower portions, and a so-called radial step between the three portions, which is connected via a curved surface, is provided.

The inspection surface 48, which forms a side wall surface on a left side of the figure of the test piece 52b having a shape similar to the shape of the inner wall surface of the ground electrode 40, has flat surfaces 81, 83, which are spaced vertically and respectively have a width (length) of 20 mm in the up-down direction, and a flat surface 82, which is disposed between these surfaces 81, 83 and approaches the inspection surface side forming a side wall surface on a right side of the figure as the flat surface 82 goes downward. Upper and lower curved surfaces 84, 85, which have central axes in the horizontal direction (the direction perpendicular to the figure in the figure) and have the same shape as a part of the cylindrical side wall having the predetermined radius (radius of curvature) R, are disposed between the flat surfaces 81, 82, and between the flat surfaces 82, 83, and form the inspection surface 48. Adjacent and parallel end portions of the flat surfaces 81, 82, 83 are smoothly connected.

The shape of each of the curved surfaces 75, 84, 85 corresponds to a part of the cylindrical side wall, and each of these faces has the fixed radius of curvature and the central axis. Further, the curved surfaces 75, 84, 85 and the adjacent flat surfaces 73, 74 or 81, 82, 83 are configured such that the upper edge and the lower edge that are in contact with each other are connected without any step, and tangents thereof match each other. When an angle at which planes including the upper and lower flat surfaces 73, 74 and the flat surfaces 81, 82, 83, which are adjacent to each other with the curved surfaces 75, 84, 85 interposed therebetween, intersect is 5 degrees or less, a distance from the intersection to the upper and lower edges of the curved surface is 17.5 mm or less.

The shapes of the test pieces according to the embodiment shown in FIGS. 3A to 4B will be described in more detail with reference to FIGS. 5 and 6. FIG. 5 is a perspective view schematically showing outlines of shapes of test pieces formed by dividing the test piece according to the embodiment shown in FIG. 3B. FIG. 6 is a perspective view schematically showing outlines of shapes of test pieces formed by dividing the test piece according to the embodiment shown in FIG. 4B.

As shown in these figures, the test pieces 52a, 52b are further respectively divided into three and two in the up-down direction. The test piece 52a is vertically divided by a plane that passes between the surfaces 71, 72 in the horizontal direction on the upper portion, and is further vertically divided by a plane as a cross section in the horizontal direction that passes through the inside of the recessed portion 76 between the surfaces 72, 73. A tip end portion shape test piece 53, a recessed inclined shape test piece 55, and an opening shape test piece 56 are formed respectively. Further, the test piece 52b is vertically divided between the surfaces 82, 85, and is divided into a projection inclined shape test piece 54 and the recessed inclined shape test piece 55. Each of the test pieces 53 to 56 has a length within 40 mm and a width within 20 mm.

A size of such a test piece can be changed according to a sample size required according to specifications of an inspection apparatus that inspects the film 42, but at a circumference of 2.5 mm, the test piece is likely to be affected by external force when the test piece is removed. Therefore, depending on conditions, it is better not to set the circumference as an analysis area. Therefore, it is desirable that the size of the test piece is 5 mm larger or more than a measurement size.

In the present embodiment, the same material as the ground electrode 40 is used for the test pieces 53 to 56 having the shapes shown in FIGS. 5 and 6, but a length (width) in the up-down direction of at least one of the flat surfaces 81, 82 forming the inspection surface 48 of the projection inclined shape test piece 54 may be shortened by about 5 mm. Further, in the present embodiment, the test pieces 52a, 52b are vertically divided into a plurality of parts, but the test piece 52a or the test piece 52b having a width of 20 to 40 mm may be used for the inspection, and a state of the film 42 on the inspection surface 48 having a plurality of shapes may be evaluated by one test piece. Further, in the present embodiment, an aluminum alloy is used as the base material of the test pieces 52a, 52b, but SUS, alumite, quartz, silicon carbide, and sintered yttria can be used. By using the same member as that used for the ground electrode 40, the accuracy of the inspection can be improved.

A step of disposing the test piece and the ground electrode 40 of the present embodiment and forming the film 42 on these surfaces in parallel will be described with reference to FIG. 7. FIG. 7 is a perspective view schematically showing a state where the ground electrode and the test pieces shown in FIGS. 3A to 6 are disposed in a step of forming a film on an inner side wall of the ground electrode according to the present embodiment shown in FIG. 2. The figure shows an arrangement of the ground electrode 40 and a test piece 45 when the film 42 having the plasma resistance is formed on the inner side wall and the upper end portion of the ground electrode 40 by an atmospheric plasma spraying (APS) method.

The APS method is a method of forming the film 42 on a surface of an object by spraying in an atmosphere at the atmospheric pressure. Raw material powder is melted by the plasma formed in the atmosphere, and the raw material in the molten or semi-molten state is sprayed on a surface of the object and laminated to form the film. At this time, a temperature of the object member (base material) whose surface is formed with the film is adjusted within a predetermined range, but in addition to a large amount of heat transferred from particles of the material of the film that is sprayed and fixed, heat is also radiated from the base material or the film through the atmosphere of the atmospheric pressure. Therefore, on the surface of the object that is sprayed and on which the film is formed, a history of heat transfer in the area and changes in the temperature and distribution due to the history are complicated, and it is necessary to devise a method for approximating the heat transfer and the temperature not only of the surface of the object but also during and after the formation of the film on the inspection surface 48 of the test piece.

Therefore, in the present embodiment, in order to approximate the heat transfer or the temperature and the change thereof, and the like on the inspection surface 48 of the test piece to those on a surface of an inner side wall member of the ground electrode 40, at least one type of the test piece 45 among the test pieces 53 to 56 shown in FIGS. 5 and 6 is disposed to the ground electrode 40 having the ring or cylindrical shape and having an axially symmetrical cross section around the central axis in the up-down direction on the outer side wall surface of the end portion (the upper end portion in the case of FIG. 1) of the ground electrode 40 where the film 42 is formed to wrap around to the inner side wall surface and the outer side wall surface. Further, a sheet (not shown) having high thermal conductivity is sandwiched between the ground electrode 40 and the test piece 45, and the test piece 45 is fixed to the ground electrode 40 using a mask tape. Further, the ground electrode 40 and the test piece 45 may be fixed with a double-sided tape having high thermal conductivity sandwiched therebetween.

On the outer side wall surface of the upper end portion of the ground electrode 40, the mask tape is used to determine a range to be formed by covering a range where the film 42 is not formed. By covering an area of the outer side wall surface of the ground electrode 40 other than the area where the test piece is disposed by the mask tape, it is possible to prevent the film 42 from being formed on a portion other than a predetermined portion of the ground electrode 40. As shown in the figure, a spray gun 46 is inserted in an inner peripheral side of the ground electrode 40 and is in a state in which a cylindrical blowout port that blows out a raw material of the spray gun 46 is held toward the inner wall surface at a predetermined angle (in the present embodiment, an angle between an axis of the blowout port from which particles of the raw material is blown out around a target and the central axis of the ground electrode 40 is 90 degrees), and the spray gun 46 is moved around the axis and in the axial direction at a predetermined radial position from the central axis while spraying and fixing the raw material to the inner side wall surface as shown by an arrow in the figure, and thus the film 42 is formed. Further, the spray gun 46 is moved outward at the upper end portion so as to be folded back from the upper end to the outer peripheral side, and is moved around the axis and in the axial direction at the predetermined radial position from the central axis, the film 42 is formed on the predetermined areas of the upper end surface and the outer side wall surface of the ground electrode 40 and the surface of the inspection surface 48 of the test piece 45.

In a state where an inner peripheral wall surface of the opening 43 disposed on the side surface of the ring-shaped ground electrode 40 and a portion around the opening 43 on the outer side wall surface of the ground electrode 40 with which the seal member such as an O-ring of the gate valve 50 abuts are covered with the mask tape to prevent the film 42 from being formed thereon, the step of forming the film 42 on the ground electrode 40 is performed. In the present embodiment, a test piece installation jig 47 for the opening which serves as a lid is disposed on an inner side of the opening 43, a position of the test piece installation jig 47 for the opening is fixed with respect to the ground electrode 40 using the mask tape, and the film 42 is formed on the inspection surface 48 on the test piece 45 and the ground electrode 40.

The test piece installation jig 47 for the opening to which the test pieces 45 are connected using the double-sided tape having high thermal conductivity and whose position is fixed is inserted into the opening 43, then the test piece installation jig 47 for the opening is fixed to the ground electrode 40 using the mask tape. While the spray gun 46 moves on a path similar to that of the inner side wall surface around the opening 43, the raw material is sprayed to form the film 42 on the inner side wall surface of the ground electrode 40 and the surfaces of the test piece installation jig 47 for the opening and the test pieces 45. That is, as if there is no opening 43 on the inner side wall surface of the ground electrode 40, the spray gun 46 moves in an inner peripheral direction of the ground electrode 40 and in a direction along the vertical central axis, continues spraying under the same conditions as those of the inner side wall surface around the opening 43, and blows out the raw material through the opening 43. The surfaces of the test piece installation jig 47 for the opening and the test pieces 45 inside the opening 43 are sprayed.

Further, a ring-shaped test piece installation jig 44 is mounted on the lower end portion of the ground electrode 40 where the film 42 is not formed to the outer side wall surface. At least one type of the test piece 45 among the test pieces 53 to 56 shown in FIGS. 5 and 6 is disposed on an inner peripheral surface thereof. The film 42 is formed on the inspection surface 48 on an upper surface of the test piece 45 under the same conditions as the inner side wall surface of the upper ground electrode 40. As on the upper end portion of the ground electrode 40, the spray gun 46 may be folded back and moved from the inner peripheral side to the outer peripheral side at an lower end of the test piece installation jig 44, so as to spray and form the film 42 to the outer side wall surface on the outer peripheral side. In this case, the test piece 45 can be inspected by forming the film 42 on the end portion of the ring-shaped member even the inspection surface 48 is provided on the end portion and the inner side and the outer side wall surfaces thereof.

Figure 8A:
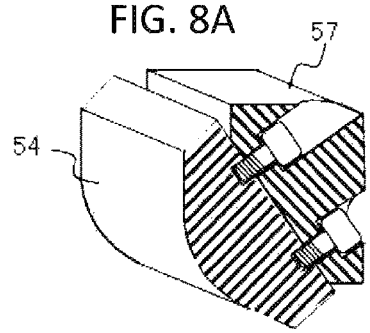
FIGS. 8A to 8C are perspective views schematically showing a state where the test pieces according to the embodiment shown in FIG. 5 are mounted on jigs.
Figure 8B:
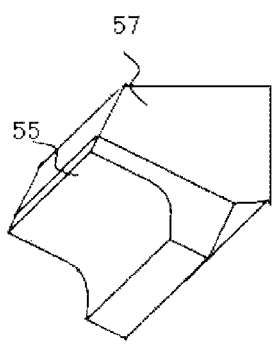
Figure 8C:
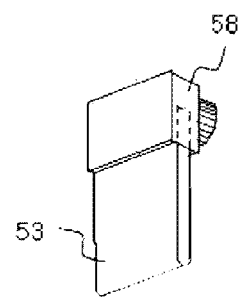

Configurations of jigs on which the test pieces of the present embodiment are mounted will be described with reference to FIGS. 8A to 8C. FIGS. 8A to 8C is a perspective view schematically showing a state where the test pieces according to the embodiment shown in FIG. 5 are mounted on the jigs.

As described above, in the step of forming the film 42 having the plasma resistance on the surface of the ground electrode 40, the test pieces 45 such as the tip end portion shape test piece 53, the projection inclined shape test piece 54, and the recessed inclined shape test piece 55 are disposed adjacent to the ground electrode 40, and the film 42 is formed on the inspection surfaces 48 in parallel. When each surface of the inspection surface 48 of each test piece is aligned with a surface of a corresponding portion of the ground electrode 40, one test piece among these test pieces may have amounting surface that is not parallel to the central axis of the ground electrode 40. For such a test piece, the test piece is mounted on an inclined test piece mounting jig 57, and is further mounted on the jig in this state. The angle of the surface of the test piece mounted on the jig with respect to an axis of the blowout port of the spray gun 46 is similar to the angle of the surface with respect to the axis of the blowout port of the spray gun 46 at a portion of the inner side wall of the ground electrode 40 corresponding to the shape of the inspection surface 48 of the test piece.

As shown in a cross-sectional view of FIG. 8A, the projection inclined shape test piece 54 is fixed to a surface of a test piece surface 57*a*, which is an inclined flat surface of the inclined test piece mounting jig 57, by a male screw or a bolt. The male screw or the bolt is inserted from an opening on the opposite side of the test piece surface 57*a* of a through hole opened to the test piece surface 57*a* of the inclined test piece mounting jig 57, and is screwed into a hole of a female screw opened on amounting surface of the projection inclined shape test piece 54. The projection inclined shape test piece 54 is fixed in position on the test piece surface 57*a* of the inclined test piece mounting jig 57.

A plane, on which the opening on the opposite side of the test piece surface 57*a* of the through hole of the screw or the bolt of the inclined test piece mounting jig 57 is disposed, is the outer side wall surface of the ground electrode 40 or a connection surface 57*b* that is connected to the test piece installation jig 44 and the test piece installation jig 47 for the opening by using the double-sided tape or the mask tape. As shown in FIG. 8B, the recessed inclined shape test piece 55 is also connected to the test piece surface 57a, which is an inclined flat surface of the inclined test piece mounting jig 57, and is fixed using the male screw or the bolt inserted into the through hole from the opening on the mounting surface 57b.

Further, as shown in FIG. 8C, in the case of the tip end shape test piece 53, the inspection surface 48 extends not only on one surface but also from a tip end surface to a back surface thereof, and the film 42 needs to be formed on these surfaces. Therefore, the tip end shape test piece 53 is configured such that an end portion opposite to the tip end portion can be inserted and mounted into or removed from a hole formed in a tip end shape test piece mounting jig 58, and is configured to be fixed by screwing the screw or the bolt in a state where the tip end shape test piece 53 is inserted into the mounting hole of the tip end shape test piece mounting jig 58.

The opening 43 can be considered as a portion where the test pieces 45 are disposed adjacently when the film is formed on the surface of the ground electrode 40.

Figure 9A:
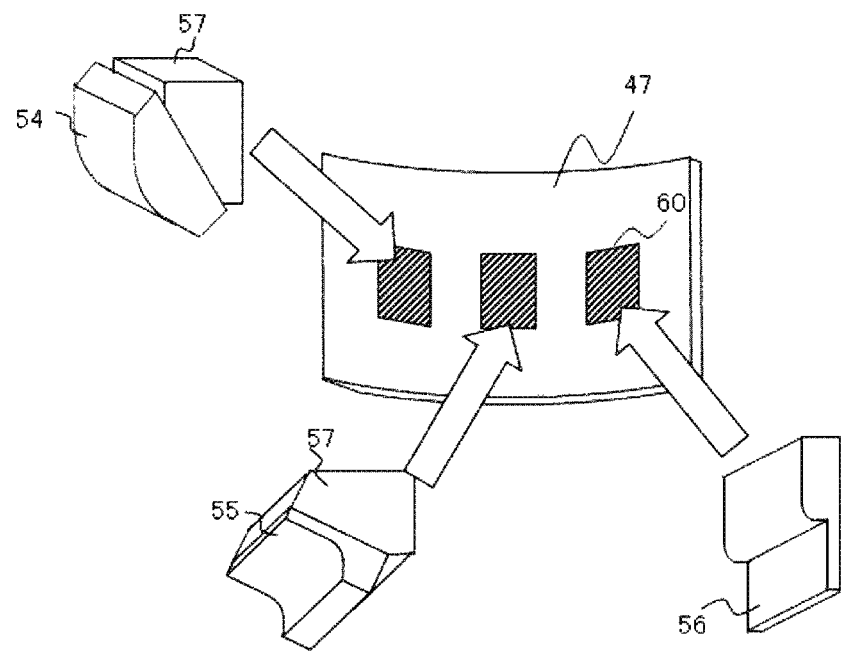
FIGS. 9A and 9B are perspective views schematically showing a state where the test pieces according to the present embodiment shown in FIGS. 8A-8C are mounted on a test piece installation jig.
Figure 9B:
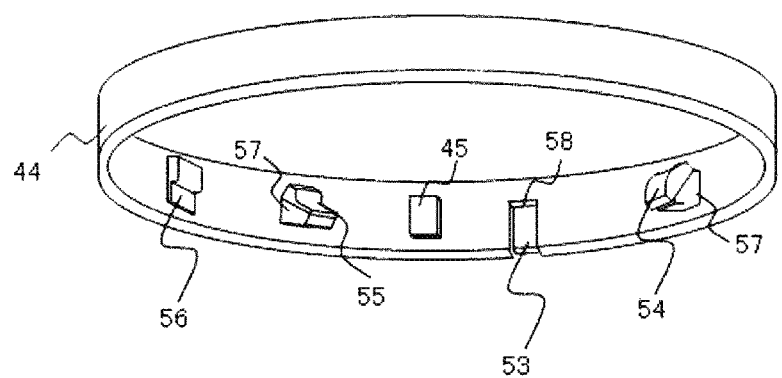

A state in which the test pieces 45 of the present embodiment are mounted on the jig will be described with reference to FIGS. 9A and 9B. FIGS. 9A and 9B are perspective views schematically showing a state where the test pieces according to the present embodiment shown in FIGS. 8A-8C are mounted on the jigs.

As shown in FIG. 9A, the test pieces 45 of the present embodiment are disposed on a plurality of test piece mounting portions 60, which are disposed on an inner side wall surface of the installation jig 47 for the opening and are made of the same material as the ground electrode 40, with sheets having high thermal conductivity interposed, and the position of each test piece 45 is fixed by using the male screw or the bolt inserted from the outer side wall surface side of the installation jig 47 for the opening. The test piece 45 may be fixed by using the double-sided tape containing the material as a main material instead of the sheet having the high thermal conductivity.

In the figure, as in an example shown by left and center arrows, when the test piece 45 has a shape of such as the projection inclined shape test piece 54 or the recessed inclined shape test piece 55, the test piece 45 is mounted on the inner side wall surface of the installation jig 47 for the opening with the inclined test piece mounting jig 57 interposed between the test piece installation jig 47 for the opening and the test piece 45. In a state where the projection inclined shape test piece 54 and the recessed inclined shape test piece 55 are connected to the inclined flat test piece surface 57a of the inclined test piece mounting jig 57, the projection inclined shape test piece 54 and the recessed inclined shape test piece 55 are fastened and fixed in position by the male screws or the bolts inserted from the mounting surface 57b on the opposite side, and in this state, the mounting surface 57b is connected to the test piece mounting portion 60 and fixed in position.

On the other hand, as in an example shown by a right arrow in the figure, for the opening shape test piece 56, when the central axis of the ground electrode 40 or the rotation axis of the spray gun 46 and a mounting surface of the opening shape test piece 56 are parallel, the opening shape test piece 56 may be connected to the test piece mounting portion 60 of the test piece installation jig 47 for the opening without another jig interposed and may be fixed by the screw or the tape.

Further, FIG. 9B shows a state where the test piece installation jig 44 having the same inner diameter and outer diameter as the ground electrode 40 is mounted on a lower end surface of the ground electrode 40 and a plurality of test pieces 45 is disposed on the inner peripheral surface of the test piece installation jig 44. In this example, an inner peripheral wall surface of the test piece installation jig 44 has a cylindrical shape matching that of the ground electrode 40 when viewed from above at the same radial position around the axis in the up-down direction, but a mounting surface of the test piece 45 is a flat surface. Therefore, in a state where the mounting surface of the test piece 45 is directly connected to the inner peripheral wall surface of the test piece installation jig 44, a gap may be generated therebetween.

In the present embodiment, in a state where a spacer made of the same material as the ground electrode 40 is mounted on the mounting surface of the test piece 45, the test piece 56 or the spacer is fixed. Further, magnitudes and angles of inclination of the inspection surface 48 with respect to the central axis of the ground electrode 40 or a movement direction of the spray gun 46 and an axial direction of the blowout port are approximated to those of the corresponding positions of the ground electrode 40, and the projection inclined shape test piece 54 and the recessed inclined shape test piece 55 are connected and fixed to the test piece installation jig 44 by using the inclined test piece mounting jig 57.

The spray gun 46 can be configured to move from a state, where the blowout port is directed toward the inner peripheral side wall of the test piece installation jig 44 connected to the lower end portion of the ground electrode 40, pass through the lower end to a portion facing the outer peripheral side wall surface and is folded back. Alternatively, the spray gun 46 can be moved in the opposite direction. Further, the lower portion of the test piece installation jig 44 has a recessed portion that is recessed from the inner peripheral side wall surface to the outer peripheral side and from the lower end surface to the upper side. The tip end shape test piece mounting jig 58 and the tip end shape test piece 53 are fitted into the recessed portion from below, and connected to the test piece installation jig 44 and fixed by using the screws or the bolts or the mask tape.

Further, the test piece installation jig 44 has a shape in which a thickness in the radial direction is larger than a thickness of the side wall portion of the ground electrode 40 mounted and connected above the upper end of the test piece installation jig 44. By fitting and connecting the inclined test piece mounting jig 57 and the tip end shape test piece mounting jig 58 to the recessed portion, it is possible to reduce the heat radiation from these test pieces to the test piece installation jig 44, and reduce deviation of histories of the heat transfer between the test piece 45 and the ground electrode 40 or deviation of histories of the temperature, and further reduce deviation of histories of the distribution thereof.

Figure 10A:
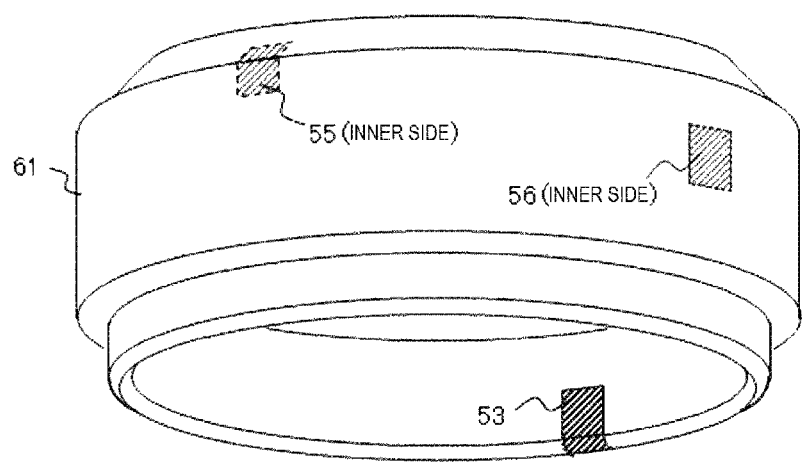
FIGS. 10A and 10B are a perspective view and a cross-sectional view schematically showing a test piece installation jig according to a modification of the embodiment shown in FIG. 7.
Figure 10B:
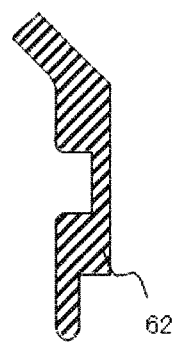

An example of a test piece installation jig 61 that further reduces the difference in the heat and the temperature value and the changes of the films 42 of the test piece 45 and the ground electrode 40 will be described with reference to FIGS. 10A and 10B. FIGS. 10A and 10B are a perspective view and a cross-sectional view schematically showing another example of the test piece installation jig according to the embodiment shown in FIG. 7.

The test piece installation jig 61 shown in FIG. 10A is a member that has a part having a cylindrical shape and is made of the same material as the ground electrode 40. At least the inner peripheral side wall surface of a cross section 62 shown in FIG. 10B has the same shape as that of the test piece 52. Further, in a direction along the central axis in the up-down direction of the test piece installation jig 61, distances from the axis to an inner peripheral side wall surface and an outer peripheral side wall surface have the same values as those of the ground electrode 40. The test piece installation jig 61 has an inner diameter and an outer diameter which are the same as those of the ground electrode 40.

The test piece installation jig 61 shown in the figure is viewed obliquely upward from a position spaced horizontally from the central axis in a state where a portion corresponding to the upper end portion of the ground electrode 40 is on the lower end, that is, the upper and lower positions are reversed. Further, the test piece installation jig 61 has at least one recessed portion which is recessed from the inner peripheral surface toward the outer peripheral side by a predetermined dimension, and the test piece 45 is fitted, mounted, and fixed into the recessed portion. In a state where the test piece installation jig 61 and the test piece 45 are connected and fixed with each other, the inspection surface 48 of the test piece 45 has a shape in which the inspection surface 48 and the inner wall surface of the test piece installation jig 61 around the inspection surface 48 have the same distances from the central axis or are close such that there is no step in heights at the end portion.

In a state where the test piece 45, for example, the tip end shape test piece 53, the recessed inclined shape test piece 55, or the opening shape test piece 56 is directly fitted into the recessed portion or in a state of being mounted on the inclined test piece mounting jig 57, the test piece 45 is fixed in position by inserting and fastening a male screw or a bolt from the outer peripheral side wall side of the test piece installation jig 61. The test piece installation jig 61 in this state is disposed adjacent to the ground electrode 40, the step of forming the film 42 on the inner side wall surface of the test piece installation jig 61 is performed in parallel with the step of forming the film 42 on the surface of the ground electrode 40, and thus the film 42 is formed on the inspection surface 48 having each of the various shapes of the test pieces 45 under the same conditions as those of the inner side wall surface of the ground electrode 40.

Further, a member for inspection, which has a ring or cylindrical shape having the same diameter as that of the ground electrode 40, is made of the same material, and whose shape of a longitudinal cross section along the central axis is the same as or similar to that of the test piece 52, can also be used as a test piece. In this case, the member for inspection having the ring or cylindrical shape has the same shape as the test piece installation jig 61.

Such a ring-shaped or cylindrical test piece may be disposed on the lower end of the ground electrode 40 instead of the test piece installation jig 44 so as to be fixed in position, and the film 42 may be formed in parallel with the ground electrode 40 and the test piece. Thereafter, as shown in FIGS. 5 and 6, apart having a shape of the inspection target is cut out from the ring-shaped or cylindrical test piece for inspection and the part is taken out as the test piece 45, and the film 42 may be inspected. In this case, considering the ease of cutting work, a base material of the test piece having the ring or cylindrical shape is preferably an aluminum alloy, SUS, or alumite.

When the test piece installation jig 44, or the test piece installation jig 61, or the test piece having the same shape as the test piece installation jig 61 is disposed on the end portion of the ground electrode 40 or on the lower end portion of the ground electrode 40 shown in FIG. 2, in the step of forming the film 42, a gap is provided such that the test piece installation jig 44 or 61 or the test piece having the same shape as the test piece installation jig 44 or 61 is not connected to the ground electrode 40 by a sprayed raw material, which is important in reducing application of an unnecessary external force to the film 42 at other portions when the test piece installation jig 44 or 61 is separated from the ground electrode 40 after the step of forming the film 42, and in improving the inspection accuracy.

In the above embodiment, an example in which the film 42 is formed by the atmospheric plasma spraying (APS) method is described. As other spraying techniques for forming the film 42, there are techniques in the related art such as low-pressure spraying (LPPS, VPS), SPS spraying, and explosion spraying. These techniques differ in an atmosphere during spraying, a method of generating a plasma flame, a method of supplying raw material powder, and the like, but in the same technical scope, a step of forming a film is provided by placing raw material powder melted at a high temperature on a gas jet, and spraying and depositing the raw material powder on a target portion of a surface of a base material. In the step of forming the film 42 in the present embodiment, the same effect can be obtained by using a technique such as the low-pressure spraying (LPPS, VPS) instead of the atmospheric plasma spraying method.

Next, an example of forming the film 42 on the inner side wall of the processing chamber by using an aerosol deposition (AD) method, a cold spray method (CS), a sputter film formation (PVD), and the like will be described with reference to FIGS. 11 and 12. FIG. 11 is a perspective view schematically showing a state where test pieces are mounted in a step of forming a film on an inner side wall of a ground electrode according to a modification of the embodiment shown in FIG. 7. FIG. 12 is a perspective view schematically showing a state where the test pieces according to the modification shown in FIG. 11 are mounted on a test piece installation jig.

It is known that the AD method is a technique for forming a film in a vacuum, and the film is formed while adjusting a temperature of a base material to an appropriate temperature, but heat transfer during formation is relatively small. In the case of such an AD method, when the film 42 is formed on the test piece, a difference between a heat history of the inspection surface 48 and a heat history of the inner side wall surface of the ground electrode 40 is smaller than that of the technique of spraying such as the APS method.

Therefore, in the step of forming the film 42 on the inner side wall surface of the ground electrode 40, the test piece 45 is disposed on the outer side wall of the end portion (the upper end portion in the case of FIG. 11) of the ground electrode 40. On the upper end portion, the film 42 is formed on the inner side wall, the upper end surface, and the outer side wall by moving a film-forming gun 63 above the upper end and to the outer peripheral side in addition to the inner side of the inner side wall of the ground electrode 40.

On the other hand, an area where the film 42 is formed on the outer peripheral side wall is defined by a mask tape, and the mask tape covers the outer side wall of the ground electrode 40 wider than an area where the test piece 45 is disposed such that the film 42 is not formed on an unnecessary position of the outer side wall of the ground electrode 40. The surface of the area not covered by the film 42 is exposed to the supply of the material of the film 42 from the film-forming gun 63, and the film 42 is formed.

The test piece 45 is fixed on the mask tape that covers the outer side wall of the ground electrode 40, or is fixed by interposing a double-sided tape having high thermal conductivity therebetween. The film-forming gun 63 moves along the inner side wall in parallel with or around the central axis in the up-down direction and supplies the raw material to the inner wall surface of the ground electrode 40 by blowing out the raw material from the blowout port, and then forms the film 42. Further, on the upper end portion, the film-forming gun 63 moves outward from above the upper end surface, folds back, and moves in parallel to the central axis or in a peripheral direction along the outer side wall surface. At the same time, the film 42 is formed on these surfaces including the inspection surface 48 of the test piece 45.

When a film is formed by the aerosol deposition (AD) method, an AD film-forming gun is used as the film-forming gun 63. In the case of using the cold spray method (CS), a cold spray gun is used as the film-forming gun 63, and in the case of sputter film formation (PVD), an ion beam sputter gun is used as the film-forming gun 63.

Further, the inner peripheral wall surface of the opening 43 disposed on the side wall of the ground electrode 40 is covered by the mask tape so as not to form the film 42 thereon. By using the portion covered by the mask tape, the test piece installation jig 47 for the opening, which is the lid of the opening 43, is inserted inside the opening 43, is connected to the ground electrode 40 by using the mask tape, and then is fixed in position. In a state where positions of the test piece 45 and the test piece installation jig 47 for the opening are fixed with respect to the ground electrode 40, the film 42 is formed on the ground electrode 40 by spraying the raw material onto the surface of the ground electrode 40 while moving the film-forming gun 63 in a predetermined direction at a predetermined position.

Also in the example, in the step of forming the film 42 on the inner side surface of the ground electrode 40, the film-forming gun 63 continues to blow out the raw material under the same conditions as the wall surface around the opening 43 even when the movement path of the film-forming gun crosses the opening 43, and the film 42 is formed on the inspection surface 48 of the test piece 45.

At the lower end portion of the ground electrode 40 of the example, the film 42 is formed up to the lowermost end of the inner side wall surface, while the film-forming gun 63 does not move to the lower end surface or the surface of the outer side wall connected to the lower end surface, so that the film 42 is not formed on these portions. Therefore, the ring-shaped test piece installation jig 44 shown in FIGS. 9A and 9B or the test piece installation jig 61 shown in FIGS. 10A and 10B may be mounted on the lower end portion of the ground electrode 40 and the test piece 45 may be disposed on the inner side wall (inner peripheral wall surface). In this case, when the tip end shape test piece 53 is mounted on the jig, and the film 42 is formed on the inner side surfaces of the ground electrode 40 and the jig disposed below the lower end of the ground electrode 40 with a gap and the inspection surface 48 of the test piece 45 mounted on the jig as the upper end portion of the ground electrode 40, the film-forming gun 63 is moved below the lower end of the jig, then is moved to the outer peripheral side of the outer side wall and folded back, and is moved along the outer side wall. Accordingly, the film 42 can be formed on the outer side wall surface and the inspection surface 48 on the test piece 45 including the tip end shape test piece 53 on the jig.

When the AD method, the CP method, the PVD method, or the like is used, since the temperature change at the portion where the film 42 is formed is relatively gentle, a simple ring-shaped test piece installation jig 64 as shown in FIG. 12 can be used. The test piece installation jig 64 has the same inner diameter as the lower end of the ground electrode 40 and a smaller outer shape, and has a ring shape whose length in the up-down direction is smaller than that of the test piece installation jig 44. A plurality of test pieces 45 can be mounted on or removed from the inner peripheral wall surface of the test piece installation jig 64.

Similar to the above example, the ring-shaped inner peripheral side wall surface of the test piece installation jig 64 shown in this figure has a cylindrical shape and is curved in the peripheral direction, whereas the mounting surface of the test piece 45 or the inclined test piece mounting jig 57 is a flat surface. Therefore, a spacer (not shown), which fills a gap between the test piece installation jig 64 and the test piece 45 or the inclined test piece mounting jig 57 when the two are connected, is made of the same material as the ground electrode, and is fixed by being interposed between the test piece 45 or the inclined test piece mounting jig 57 and the inner peripheral wall surface of the test piece installation jig 64. In particular, when it is necessary to dispose the projection inclined shape test piece 54 and the recessed inclined shape test piece 55 with inclination, the projection inclined shape test piece 54 and the recessed inclined shape test piece 55 are fixed to the test piece installation jig 64 using the inclined test piece mounting jig 57.

The test piece installation jig 64 of the example can fix the test piece 45 such that the test piece 45 protrudes from the lower end of the test piece installation jig 64. The recessed portion that is recessed upward from the lower end portion of the test piece installation jig 64 is disposed, and the test piece 45 is inserted and fixed by using screws or bolts. By inserting the tip end shape test piece mounting jig 58 and the tip end shape test piece 53 into the recessed portion and fixing the tip end shape test piece mounting jig 58 and the tip end shape test piece 53 by screws or bolts or by a mask tape, the film 42 can be formed on the inspection surface 48 preset on the tip end portion (lower end portion in the figure) of the tip end shape test piece 53 protruding downward from the lower end portion of the test piece installation jig 64 by moving the film-forming gun 63 over the inner peripheral side, the tip end, and the outer peripheral side of the test piece installation jig 64 or the ground electrode 40.

In an example shown in FIG. 12, the test piece installation jig 64 is mounted on the lower end of the ground electrode 40, and the test piece 45 is disposed and fixed with the tip end thereof protruding downward from the lower end portion of the test piece installation jig 64. Therefore, the formation of the inspection surface 48 using the tip end shape test piece 53 that approximates the upper end portion of the ground electrode 40 having a portion where the film 42 is formed on the inner peripheral side and the outer peripheral side and the accuracy of the inspection of the film 42 on the tip end portion can be improved.

Also in the example, the test piece installation jig 64 is mounted on the end portion (the lower end portion in the above example) of the ground electrode 40 with a gap provided therebetween and the relative arrangement position is fixed. Therefore, it is similar to the above example in the point that an unnecessary external force can be prevented from being applied to the film 42 during film formation or removal so as to prevent the state of the film 42 from being different from that in the manufacturing process for mass production of the ground electrode 40. However, in the example, the test piece installation jig 64 can be disposed with a gap smaller than that in the case of forming the film 42 using the APS method.

Next, an embodiment of the inspection is shown in FIGS. 13 and 16. In the present embodiment, the film 42 formed on the inspection surface 48 of the test piece 45 by the above steps is inspected as a target for specific items. As the items, porosity, surface roughness (Ra), contamination (contaminant element), a crystallite size, a phase ratio, a residual stress after film formation and a post-treatment are detected, and it is determined whether a detection result is within a predetermined permissible range.

In the example, the porosity is detected by a liquid impregnation method. Further, the surface roughness (Ra) is detected by calculating an arithmetic square root of sum based on a result obtained by an atomic force microscope (AFm) having a long Z stroke or an optical surface texture measuring instrument (ZYGO). Further, the presence or absence of the contaminant element other than Y, O, F, and C is detected by fluorescent X-ray analysis.

On the other hand, the phase ratio is detected using X-ray diffraction. In the X-ray diffraction, integrated intensity of a diffracted X-ray from each crystal phase is detected with an incident angle fixed at 1° and 2θ within a range of 15° to 40°. The phase ratio is detected by a reference intensity ratio (RIR) method using the obtained integrated intensity. An average crystallite size is also detected using the X-ray diffraction. The X-ray diffraction from each crystal phase can be detected with the incident angle fixed at 1.5° and 2θ within the range of 10° to 100°. Each diffraction peak is indexed to obtain a half-width, and the average crystallite size is obtained by a Hall method. The residual stress is obtained using a 2θ–Sin 2ψ method, which is a residual stress measuring method using X-rays.

An example of a result of the inspection items obtained in this way will be described below with reference to FIG. 13.

In the example, the films 42 having different average crystallite sizes are formed on the inspection surface 48 of any test piece 45, each average crystallite size is detected, and a correlation between the average crystallite size and the number of generated foreign particles is examined. A result is shown in FIG. 13. FIG. 13 is a graph showing the correlation between the average crystallite size and the number of the generated foreign particles of the film on the inspection surface of the test piece according to the present embodiment shown in FIGS. 3A and 3B. In the example of the figure, a relationship is shown in which the number of the generated foreign particles decreases as the average crystallite size decreases, which means that by reducing the average crystallite size of the material forming the film 42, the generation of the foreign particles from the film 42 is reduced.

FIG. 14 is a graph showing a correlation between a hexagonal crystal phase ratio and the number of the generated foreign particles of the film on the inspection surface of the test piece according to the present embodiment shown in FIGS. 3A and 3B. The figure shows an example in which the films 42 having different hexagonal crystal phase ratios are formed on the inspection surface 48 of any test piece 45, and the correlation between each hexagonal crystal phase ratio and the number of the generated foreign particles is examined. Also in the example, a correlation is shown in which the number of the generated foreign particles decreases as the hexagonal crystal phase ratio decreases. As described above, it can be seen that the crystallite size of the film 42 of the test piece 45 and the hexagonal crystal phase ratio (high temperature phase ratio) that increases as the temperature during formation increases are actually in the same state as the film 42 of the ground electrode 40 disposed inside the processing chamber 7 based on results shown in FIGS. 13 and 14.

FIG. 15 is a graph showing changes in the average crystallite size and the hexagonal crystal phase ratio of the film with respect to a temperature change of a base material when the film is formed on the inspection surface of the test piece shown in FIGS. 3A and 3B. In the figure, the average crystallite size is indicated by a marker ● on a left axis, and the hexagonal crystal phase ratio is indicated by a marker ■ on a right axis.

As shown in this figure, it is shown that the average crystallite size and the high temperature phase ratio obviously change with the temperature change of the surface of the base material. From the result of the figure and the results of FIG. 13 and FIG. 14, it is suggested that when the film 42 is formed, at a position where the temperature of the surface is changed, the number of the generated foreign particles is different from that of other positions where a temperature value or change is different. That is, it is assumed that, in the projection inclined shape test piece 54 or the recessed inclined shape test piece 55, the number of the generated foreign particles is different from that of the film 42 of the tip end shape test piece 53 having a flat shape, for example.

This is because an angle between a spray direction of the spray gun 46 and a normal line of the surface of the ground electrode 40 can be controlled to some extent by multi-axis control of the spray gun. However, since the spray gun 46 moves along the central axis of the ground electrode 40 (or an axis assumed to be along the ground electrode 40) to form the film 42, in an area where an angle between the normal line of the surface of the ground electrode 40 and the central axis changes, for example, in a surface of a portion having a projection shape or a recessed shape, it is very difficult to make the angle or a distance between the spray gun 46 and the ground electrode 40 constant like other portions where the normal line is perpendicular to the central axis. Therefore, it is difficult to adjust a temperature of the surface during the formation of the film 42 at such a portion to be equal to those at other portions.

Further, at a projection portion of the projection inclined shape test piece 54 and an opening end of the opening shape test piece 56, heat radiation during the formation of the film 42 tends to be relatively large as compared to other portions, and the temperature of the surface tends to be small. On the contrary, heat tends to be concentrated in the recessed portion of the recessed inclined shape test piece 55 and the tip end portion of the tip end shape test piece 53, so that the temperature of the surface tends to be higher than other portions. As shown in FIG. 15, it is assumed that the number of the generated foreign particles in such a portion is significantly different from those in other portions.

It is important for inspection and control to reproduce the formation of the film 42 under standard conditions by using a test piece having a flat plate shape that approximates a large area of the entire ground electrode 40. However, in reducing the generation of the foreign particles inside the processing chamber 7 of the plasma processing apparatus 100 for manufacturing the semiconductor device, the entire area of the ground electrode 40 has the end portion of the film 42, or a shape of the tip end portion, the projection portion or the recessed portion on which the film 42 is folded back and formed even if a ratio of these portions in the total area of the ground electrode 40 is small, but the angles of the surfaces (normal line) to the central axis of the ground electrode 40 at these portions are different from that of a portion along the direction of the central axis, and therefore these portions where the number of the generated foreign particles is different are important inspection and control point for predicting or reducing the number of the generated foreign particles.

FIG. 16 is a graph showing a correlation between the film which is on the inspection surface of the test piece according to the embodiment of FIGS. 3A and 3B and in which the number of the generated foreign particles is different and a depth distribution of the residual stress. In the example, the residual stress is obtained using the 2θ–Sin 2ψ method, which is a residual stress measuring method using X-rays. In the usual 2θ–Sin 2ψ method, since a penetration depth of X-rays changes when ψ it is changed, in order to make the penetration depth of X-rays constant, detection is performed by adjusting an incident angle of X-rays and an inclination angle of the sample.

A longitudinal axis of the figure shows a magnitude of a compressive residual stress, and a lateral axis shows the penetration depth of X-rays under measured conditions. Data of the film 42 with a large amount of the generated foreign particles is indicated by the marker ●, data of the film 42 with a small amount of the generated foreign particles is indicated by the marker ■, and data of the film 42 with a moderate amount of the generated foreign particles is indicated by a marker ◇.

As shown in the figure, it can be seen that the film 42 in which the number of the generated foreign particles is small has a relatively large compressive residual stress as compared with the other examples. In particular, difference in the magnitude of the residual stress at a portion near the surface of the film 42 is more clearly seen.

It is known that the residual stress of the film 42 formed by APS spraying is generally small, but unlike the case where the film 42 is formed on a surface of a flat portion, in the projection portion of the projection inclined shape test piece 54, the recessed portion of the recessed inclined shape test piece 55, and the tip end portion of the tip end shape test piece 53, the compressive residual stress decreases depending on temperature change (for example, cooling) after the film 42 is formed, and is in a state of a tensile residual stress. Since the residual stress of the film 42 at a portion having a complicated shape is in a residual stress state different from the residual stress at the portion having a flat shape, it is important to inspect the residual stress of the surface in order to inspect the quality of generated foreign particles of an inner wall material film.

It is possible to give the compressive residual stress to the portions of the film 42 having different residual stresses by applying chemical polishing or the like to the surface of the film 42.

As in the above embodiment, for the film 42 formed on the inspection surface 48 of the test piece 45 in parallel with the step of forming the film 42 on the surface of the ground electrode 40, parameters that are inspection items such as the porosity, the surface roughness (Ra), the crystallite size, the phase ratio, and the residual stress are detected, and it is determined whether values of these results are within the permissible range. The ground electrode 40 formed in the step in which the values are out of the permissible range is not used as a member of the processing chamber 7. Alternatively, by adjusting conditions for forming the film 42 such that the inspection items fall within the permissible range and using the conditions as the conditions for forming the film 42 of the ground electrode 40 later, the quality of the film 42 formed on the surface of the ground electrode 40 can be controlled. By using such a ground electrode 40 and the manufacturing process thereof, it is possible to reduce the generation of the foreign particles in the processing chamber 7 of the plasma processing apparatus 100 and improve the processing yield of the wafer 4. The ground electrodes 40 formed in a large number match the corresponding results of each inspection in a one-to-one relationship. The ground electrode 40 that has the film 42 with a large number of generated foreign particles is detected and selected. Therefore, highly accurate quality control is realized.

REFERENCE SIGN LIST

1: vacuum container
2: shower plate
3: window member
4: wafer
7: processing chamber
6: stage
8: gap
9: through hole
11: dry pump
12: turbo molecular pump as exhaust unit
13: impedance matching device
14: high frequency power supply
15: plasma
16: pressure adjusting unit
17: valve
18: valve
19: valve
20: magnetron oscillator
21: waveguide
22: solenoid coil
23: solenoid coil
40: ground base material
41: side wall member
42: film
43: opening
44: test piece installation jig
45: test piece
46: spray gun
47: test piece installation jig for opening
48: inspection surface
50: processing gas supply pipe
51: valve
52: test piece
53: tip end shape test piece
54: projection inclined shape test piece
55: recessed inclined shape test piece
56: opening shape test piece
57: inclined test piece mounting jig
58: tip end shape test piece mounting jig
60: test piece mounting portion laid with highly conductive sheet
61: test piece installation jig
62: cross-sectional shape of test piece installation jig
63: film-forming gun
64: simple ring-shaped test piece installation jig
75: pressure sensor

The invention claimed is:

1. A manufacturing method of an interior member which is arranged inside a processing chamber disposed inside a vacuum container of a plasma processing apparatus configured to process a wafer by using plasma formed in the processing chamber, and which includes, on a surface of said interior member, a first film of a material having resistance to the plasma, the manufacturing method of the interior member comprising:

a step of forming the first film by spraying the material onto the surface of the interior member by moving a gun by a predetermined distance along the surface of the interior member, and forming a second film by spraying the material on a surface of a test piece which has a shape simulating a surface shape of the interior member and which is disposed within a range of the predetermined distance, by moving the gun within the predetermined distance; and a step of adjusting a condition of forming the first film on the surface of the interior member by the gun, based on a result of detecting at least one of a crystal size of the second film on the surface of the test piece, a residual stress, and a contaminant element.

2. The manufacturing method of an interior member according to claim 1, wherein
the test piece is disposed with a gap provided between an end portion of the interior member and the test piece in a movement direction of the gun.

3. The manufacturing method of an interior member according to claim 2, wherein
the surface of the test piece has a shape simulating a shape of an opening or the end portion of the interior member or a portion where an inclined angle of the surface of the interior member changes with respect to the movement direction of the gun.

4. The manufacturing method of an interior member according to claim 2, wherein
the surface of the test piece has a shape simulating a shape of a surface of a portion among the surface of the interior member that is not perpendicular to a direction in which the gun sprays the material.

5. The manufacturing method of an interior member according to claim 2, wherein
the interior member has a central axis around which the surface is disposed concentrically and equidistantly, and the gun moves along a direction of the central axis and forms the first and second films on the surfaces of the interior member and the test piece that rotate around the central axis.

6. The manufacturing method of an interior member according to claim 1, wherein
the surface of the test piece has a shape simulating a shape of an opening or the end portion of the interior member or a portion where an inclined angle of the surface of the interior member changes with respect to a movement direction of the gun.

7. The manufacturing method of an interior member according to claim 1, wherein
the surface of the test piece has a shape simulating a shape of a surface of a portion among the surface of the interior member that is not perpendicular to a direction in which the gun sprays the material.

8. The manufacturing method of an interior member according to claim 1, wherein
the interior member has a central axis around which the surface is disposed concentrically and equidistantly, and the gun moves along a direction of the central axis and forms the first and second films on the surfaces of the interior member and the test piece that rotate around the central axis.

9. An inspection method of an interior member which is arranged inside a processing chamber disposed inside a vacuum container of a plasma processing apparatus configured to process a wafer by using plasma formed in the processing chamber, and which includes, on a surface of the interior member, a first film of a material having resistance to the plasma, the inspection method of the interior member comprising:

a step of forming the first film by spraying the material onto the surface of the interior member by moving a gun by a predetermined distance along the surface of the interior member, and forming a second film by spraying the material on a surface of a test piece which has a shape simulating a surface shape of the interior member and which is disposed within a range of the predetermined distance, by moving the gun within the predetermined distance; and a step of inspecting formation of the first film on the surface of the interior member performed by the gun, based on a result of detecting at least one of a crystal size of the second film on the surface of the test piece, a residual stress, and a contaminant element.

10. The inspection method of an interior member according to claim 9, wherein
the test piece is disposed with a gap provided between an end portion of the interior member and the test piece in a movement direction of the gun.

11. The inspection method of an interior member according to claim 10, wherein
the surface of the test piece has a shape simulating a shape of an opening or the end portion of the interior member or an inclined portion where an inclined angle of the surface of the interior member changes with respect to the movement direction of the gun.

12. The inspection method of an interior member according to claim 10, wherein
the surface of the test piece has a shape simulating a shape of a surface of a portion among the surface of the interior member that is not perpendicular to a direction in which the gun sprays the material.

13. The inspection method of an interior member according to claim 10, wherein
the interior member has a central axis around which the surface is disposed concentrically and equidistantly, and the gun moves along a direction of the central axis and forms the first and second films on the surfaces of the interior member and the test piece that rotate around the central axis.

14. The inspection method of an interior member according to claim 9, wherein
the surface of the test piece has a shape simulating a shape of an opening or the end portion of the interior member or an inclined portion where an inclined angle of the surface of the interior member changes with respect to a movement direction of the gun.

15. The inspection method of an interior member according to claim 9, wherein
the surface of the test piece has a shape simulating a shape of a surface of a portion among the surface of the interior member that is not perpendicular to a direction in which the gun sprays the material.

16. The inspection method of an interior member according to claim 9, wherein
the interior member has a central axis around which the surface is disposed concentrically and equidistantly, and the gun moves along a direction of the central axis and forms the first and second films on the surfaces of the interior member and the test piece that rotate around the central axis.

* * * * *